US011373921B2

(12) United States Patent
Zhang et al.

(10) Patent No.: US 11,373,921 B2
(45) Date of Patent: Jun. 28, 2022

(54) GEL-TYPE THERMAL INTERFACE MATERIAL WITH LOW PRE-CURING VISCOSITY AND ELASTIC PROPERTIES POST-CURING

(71) Applicant: Honeywell International Inc., Morris Plains, NJ (US)

(72) Inventors: Kai Zhang, Shanghai (CN); Liqiang Zhang, Shanghai (CN); Ling Shen, Shanghai (CN); Ya Qun Liu, Shanghai (CN)

(73) Assignee: Honeywell International Inc., Charlotte, NC (US)

( * ) Notice: Subject to any disclaimer, the term of this patent is extended or adjusted under 35 U.S.C. 154(b) by 177 days.

(21) Appl. No.: 16/844,916

(22) Filed: Apr. 9, 2020

(65) Prior Publication Data
US 2020/0343154 A1 Oct. 29, 2020

Related U.S. Application Data

(60) Provisional application No. 62/837,442, filed on Apr. 23, 2019.

(51) Int. Cl.
| | | |
|---|---|---|
| *C08L 83/04* | (2006.01) | |
| *H01L 23/36* | (2006.01) | |
| *C08G 77/20* | (2006.01) | |
| *C08K 3/22* | (2006.01) | |
| *C08G 77/16* | (2006.01) | |

(52) U.S. Cl.
CPC .............. *H01L 23/36* (2013.01); *C08G 77/16* (2013.01); *C08G 77/20* (2013.01); *C08K 3/22* (2013.01); *C08L 83/04* (2013.01); *C08K 2003/2227* (2013.01); *C08K 2201/001* (2013.01)

(58) Field of Classification Search
CPC ......... C08G 77/12; C08G 77/20; C08L 83/04; H01L 23/36
See application file for complete search history.

(56) References Cited

U.S. PATENT DOCUMENTS

| | | | |
|---|---|---|---|
| 1,655,133 A | 1/1928 | Clase | |
| 2,451,600 A | 10/1948 | Woodcock | |
| 2,810,203 A | 10/1957 | Bachofer | |
| 3,262,997 A | 7/1966 | Cameron et al. | |
| 4,006,530 A | 2/1977 | Nicolas | |
| 4,087,918 A | 5/1978 | Schmid et al. | |
| 4,180,498 A | 12/1979 | Spivack | |
| 4,265,026 A | 5/1981 | Meyer | |
| 4,446,266 A | 5/1984 | Von et al. | |
| 4,459,185 A | 7/1984 | Obata et al. | |
| 4,559,709 A | 12/1985 | Beseme et al. | |
| 4,565,610 A | 1/1986 | Nobel et al. | |
| 4,604,424 A | 8/1986 | Cole et al. | |
| 4,652,624 A | 3/1987 | Allen et al. | |
| 4,787,149 A | 11/1988 | Possati et al. | |
| 4,816,086 A | 3/1989 | Oleske | |
| 4,832,781 A | 5/1989 | Mears | |
| 4,839,955 A | 6/1989 | Jean | |
| 4,871,782 A * | 10/1989 | Modic | C08J 9/02 521/88 |
| 4,910,050 A | 3/1990 | Oldham et al. | |
| 5,162,555 A | 11/1992 | Remmers et al. | |
| 5,167,851 A | 12/1992 | Jamison et al. | |
| 5,294,923 A | 3/1994 | Juergens et al. | |
| 5,391,924 A | 2/1995 | Uchida et al. | |
| 5,403,580 A | 4/1995 | Bujanowski et al. | |
| 5,562,814 A | 10/1996 | Kirby | |
| 5,660,917 A | 8/1997 | Fujimori et al. | |
| 5,816,699 A | 10/1998 | Keith et al. | |
| 5,930,115 A | 7/1999 | Tracy et al. | |
| 5,950,066 A | 9/1999 | Hanson et al. | |
| 6,040,362 A | 3/2000 | Mine et al. | |
| 6,054,198 A | 4/2000 | Bunyan et al. | |
| 6,090,484 A | 7/2000 | Bergerson | |
| 6,096,414 A | 8/2000 | Young | |
| 6,165,612 A | 12/2000 | Misra | |
| 6,197,859 B1 | 3/2001 | Hanson et al. | |

(Continued)

FOREIGN PATENT DOCUMENTS

| | | |
|---|---|---|
| CA | 2311067 A1 | 1/2001 |
| CA | 2433637 A1 | 12/2002 |

(Continued)

OTHER PUBLICATIONS

"Dynasylan 1146: Oligomeric Diamino-Silane-System" Evonik Industries, pp. 1-3, 2008.
"Hi-Flow 225F-AC Reinforced, Phase Change Thermal Interlace Material," The Bergquist Company, 1 page, available at least as early as the filing date of the present application.
Phase Change Material: DAPCM80-1'\MH&W International Corp., May 2012, http://mhw-thermal.com, 1 pages.

(Continued)

*Primary Examiner* — Kuo Liang Peng

(74) *Attorney, Agent, or Firm* — Faegre Drinker Biddle & Reath LLP

(57) ABSTRACT

The present disclosure provides thermal interface materials that are useful in transferring heat from heat generating electronic devices, such as computer chips, to heat dissipating structures, such as heat spreaders and heat sinks. The thermal interface material is soft and has elastic properties post-curing along with high thermally conductive filler loading. The thermal interface material includes at least one long chain alkyl silicone oil; at least one long chain, vinyl terminated alkyl silicone oil; at least one long chain, single end hydroxyl terminated silicone oil; at least one thermally conductive filler, at least one coupling agent, at least one catalyst, at least one crosslinker, and at least one addition inhibitor.

20 Claims, 3 Drawing Sheets

(56) References Cited

U.S. PATENT DOCUMENTS

| | | |
|---|---|---|
| 6,238,596 B1 | 5/2001 | Nguyen et al. |
| 6,339,120 B1 | 1/2002 | Misra et al. |
| 6,372,337 B2 | 4/2002 | Takahashi et al. |
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 | 9/2002 | Nguyen |
| 6,475,962 B1 | 11/2002 | Khatri |
| 6,496,373 B1 | 12/2002 | Chung |
| 6,500,891 B1 | 12/2002 | Kropp et al. |
| 6,506,332 B2 | 1/2003 | Pedigo |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,645,643 B2 | 11/2003 | Zafarana et al. |
| 6,649,325 B1 | 11/2003 | Gundale et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |
| 6,811,725 B2 | 11/2004 | Nguyen et al. |
| 6,815,486 B2 | 11/2004 | Bhagwagar et al. |
| 6,835,453 B2 | 12/2004 | Greenwood et al. |
| 6,838,182 B2 | 1/2005 | Kropp et al. |
| 6,841,757 B2 | 1/2005 | Marega et al. |
| 6,874,573 B2 | 4/2005 | Collins et al. |
| 6,900,163 B2 | 5/2005 | Khatri |
| 6,901,675 B2 | 6/2005 | Edwards et al. |
| 6,908,669 B2 | 6/2005 | Nguyen |
| 6,908,682 B2 | 6/2005 | Mistele |
| 6,913,686 B2 | 7/2005 | Hilgarth |
| 6,921,780 B2 | 7/2005 | Ducros et al. |
| 6,924,027 B2 | 8/2005 | Matayabas et al. |
| 6,926,955 B2 | 8/2005 | Jayaraman et al. |
| 6,940,721 B2 | 9/2005 | Hill |
| 6,946,190 B2 | 9/2005 | Bunyan |
| 6,956,739 B2 | 10/2005 | Bunyan |
| 6,975,944 B1 | 12/2005 | Zenhausern |
| 6,984,685 B2 | 1/2006 | Misra et al. |
| 7,013,965 B2 | 3/2006 | Zhong et al. |
| 7,038,009 B2 | 5/2006 | Sagal et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,119,143 B2 | 10/2006 | Jarnjevic et al. |
| 7,135,232 B2 | 11/2006 | Yamada et al. |
| 7,147,367 B2 | 12/2006 | Balian et al. |
| 7,172,711 B2 | 2/2007 | Nguyen |
| 7,208,191 B2 | 4/2007 | Freedman |
| 7,241,707 B2 | 7/2007 | Meagley et al. |
| 7,244,491 B2 | 7/2007 | Nguyen |
| 7,253,523 B2 | 8/2007 | Dani et al. |
| 7,262,369 B1 | 8/2007 | English |
| 7,291,396 B2 | 11/2007 | Huang et al. |
| 7,294,394 B2 | 11/2007 | Jayaraman et al. |
| RE39,992 E | 1/2008 | Misra et al. |
| 7,326,042 B2 | 2/2008 | Alper et al. |
| 7,328,547 B2 | 2/2008 | Mehta et al. |
| 7,369,411 B2 | 5/2008 | Hill et al. |
| 7,440,281 B2 | 10/2008 | Bailey et al. |
| 7,446,158 B2 | 11/2008 | Okamoto et al. |
| 7,462,294 B2 | 12/2008 | Kumar et al. |
| 7,463,496 B2 | 12/2008 | Robinson et al. |
| 7,465,605 B2 | 12/2008 | Raravikar et al. |
| 7,538,075 B2 | 5/2009 | Yamada et al. |
| 7,550,097 B2 | 6/2009 | Tonapi et al. |
| 7,572,494 B2 | 8/2009 | Mehta et al. |
| 7,608,324 B2 | 10/2009 | Nguyen et al. |
| 7,641,811 B2 | 1/2010 | Kumar et al. |
| 7,646,778 B2 | 1/2010 | Sajassi |
| 7,682,690 B2 | 3/2010 | Bunyan et al. |
| 7,695,817 B2 | 4/2010 | Lin et al. |
| 7,700,943 B2 | 4/2010 | Raravikar et al. |
| 7,732,829 B2 | 6/2010 | Murphy |
| 7,744,991 B2 | 6/2010 | Fischer et al. |
| 7,763,673 B2 | 7/2010 | Okamoto et al. |
| RE41,576 E | 8/2010 | Bunyan et al. |
| 7,765,811 B2 | 8/2010 | Hershberger et al. |
| 7,807,756 B2 | 10/2010 | Wakabayashi et al. |
| 7,816,785 B2 | 10/2010 | Iruvanti et al. |
| 7,842,381 B2 | 11/2010 | Johnson |
| 7,846,778 B2 | 12/2010 | Rumer et al. |
| 7,850,870 B2 | 12/2010 | Ahn et al. |
| 7,867,609 B2 | 1/2011 | Nguyen |
| 7,893,170 B2 | 2/2011 | Wakioka et al. |
| 7,955,900 B2 | 6/2011 | Jadhav et al. |
| 7,960,019 B2 | 6/2011 | Jayaraman et al. |
| 7,973,108 B2 | 7/2011 | Okamoto et al. |
| 8,009,429 B1 | 8/2011 | Sundstrom et al. |
| 8,039,961 B2 | 10/2011 | Suhir et al. |
| 8,076,773 B2 | 12/2011 | Jewram et al. |
| 8,081,468 B2 | 12/2011 | Hill et al. |
| 8,102,058 B2 | 1/2012 | Hsieh et al. |
| 8,105,504 B2 | 1/2012 | Gerster et al. |
| 8,110,919 B2 | 2/2012 | Jewram et al. |
| 8,112,884 B2 | 2/2012 | Tullidge et al. |
| 8,115,303 B2 | 2/2012 | Bezama et al. |
| 8,138,239 B2 | 3/2012 | Prack et al. |
| 8,167,463 B2 | 5/2012 | Loh |
| 8,223,498 B2 | 7/2012 | Lima |
| 8,308,861 B2 | 11/2012 | Rolland et al. |
| 8,324,313 B2 | 12/2012 | Funahashi |
| 8,362,607 B2 | 1/2013 | Scheid et al. |
| 8,373,283 B2 | 2/2013 | Masuko et al. |
| 8,431,647 B2 | 4/2013 | Dumont et al. |
| 8,431,655 B2 | 4/2013 | Dershem |
| 8,445,102 B2 | 5/2013 | Strader et al. |
| 8,518,302 B2 | 8/2013 | Gerster et al. |
| 8,535,478 B2 | 9/2013 | Pouchelon et al. |
| 8,535,787 B1 | 9/2013 | Lima |
| 8,557,896 B2 | 10/2013 | Jeong et al. |
| 8,586,650 B2 | 11/2013 | Zhang et al. |
| 8,587,945 B1 | 11/2013 | Hartmann et al. |
| 8,618,211 B2 | 12/2013 | Bhagwagar et al. |
| 8,632,879 B2 | 1/2014 | Weisenberger |
| 8,633,478 B2 | 1/2014 | Cummings et al. |
| 8,638,001 B2 | 1/2014 | Kimura et al. |
| 8,647,752 B2 | 2/2014 | Strader et al. |
| 8,758,892 B2 | 6/2014 | Bergin et al. |
| 8,796,068 B2 | 8/2014 | Stender et al. |
| 8,837,151 B2 | 9/2014 | Hill et al. |
| 8,865,800 B2 | 10/2014 | Stammer et al. |
| 8,917,510 B2 | 12/2014 | Boday et al. |
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,353,304 B2 | 5/2016 | Merrill et al. |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,056,314 B2 | 8/2018 | Lowe et al. |
| 10,155,894 B2 | 12/2018 | Liu et al. |
| 10,287,471 B2 | 5/2019 | Zhang et al. |
| 10,312,177 B2 | 6/2019 | Zhang et al. |
| 10,501,671 B2 | 12/2019 | Zhang et al. |

(56) References Cited

U.S. PATENT DOCUMENTS

| | | |
|---|---|---|
| 10,781,349 B2 | 9/2020 | Zhang et al. |
| 2002/0018885 A1 | 2/2002 | Takahashi et al. |
| 2002/0132896 A1 | 9/2002 | Nguyen |
| 2002/0140082 A1 | 10/2002 | Matayabas |
| 2002/0143092 A1 | 10/2002 | Matayabas |
| 2003/0031876 A1 | 2/2003 | Obeng et al. |
| 2003/0068487 A1 | 4/2003 | Nguyen et al. |
| 2003/0112603 A1 | 6/2003 | Roesner et al. |
| 2003/0128521 A1 | 7/2003 | Matayabas et al. |
| 2003/0151030 A1 | 8/2003 | Gurin |
| 2003/0159938 A1 | 8/2003 | Hradil |
| 2003/0171487 A1 | 9/2003 | Ellsworth et al. |
| 2003/0178139 A1 | 9/2003 | Clouser et al. |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0037965 A1 | 2/2004 | Salter |
| 2004/0053059 A1 | 3/2004 | Mistele |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0045855 A1 | 3/2005 | Tonapi et al. |
| 2005/0072334 A1 | 4/2005 | Czubarow et al. |
| 2005/0110133 A1 | 5/2005 | Yamada et al. |
| 2005/0148721 A1 | 7/2005 | Tonapi et al. |
| 2005/0228097 A1 | 10/2005 | Zhong |
| 2005/0256291 A1 | 11/2005 | Okamoto et al. |
| 2005/0287362 A1 | 12/2005 | Garcia-Ramirez et al. |
| 2006/0040112 A1 | 2/2006 | Dean et al. |
| 2006/0057364 A1 | 3/2006 | Nguyen |
| 2006/0094809 A1 | 5/2006 | Simone et al. |
| 2006/0122304 A1 | 6/2006 | Matayabas |
| 2006/0155029 A1 | 7/2006 | Zucker |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0013054 A1 | 1/2007 | Ruchert et al. |
| 2007/0051773 A1 | 3/2007 | Ruchert et al. |
| 2007/0097651 A1 | 5/2007 | Canale et al. |
| 2007/0116626 A1 | 5/2007 | Pan et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0166554 A1 | 7/2007 | Ruchert et al. |
| 2007/0179232 A1 | 8/2007 | Collins et al. |
| 2007/0219312 A1 | 9/2007 | David |
| 2007/0241303 A1 | 10/2007 | Zhong et al. |
| 2007/0241307 A1 | 10/2007 | Nguyen |
| 2007/0249753 A1 | 10/2007 | Lin et al. |
| 2007/0293604 A1 | 12/2007 | Frenkel et al. |
| 2008/0021146 A1 | 1/2008 | Komatsu et al. |
| 2008/0023665 A1 | 1/2008 | Weiser et al. |
| 2008/0044670 A1 | 2/2008 | Nguyen |
| 2008/0110609 A1 | 5/2008 | Fann et al. |
| 2008/0116416 A1 | 5/2008 | Chacko |
| 2008/0141629 A1 | 6/2008 | Alper et al. |
| 2008/0149176 A1 | 6/2008 | Sager et al. |
| 2008/0269405 A1 | 10/2008 | Okamoto et al. |
| 2008/0291634 A1 | 11/2008 | Weiser et al. |
| 2008/0302064 A1 | 12/2008 | Rauch |
| 2009/0053515 A1 | 2/2009 | Luo et al. |
| 2009/0072408 A1 | 3/2009 | Kabir et al. |
| 2009/0111925 A1 | 4/2009 | Burnham et al. |
| 2009/0184283 A1 | 7/2009 | Chung et al. |
| 2010/0040768 A1 | 2/2010 | Dhindsa |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2010/0256280 A1 | 10/2010 | Bruzda |
| 2010/0304152 A1 | 12/2010 | Clarke |
| 2011/0000516 A1 | 1/2011 | Hershberger et al. |
| 2011/0038124 A1 | 2/2011 | Burnham et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0192564 A1 | 8/2011 | Mommer et al. |
| 2011/0204280 A1 | 8/2011 | Bruzda |
| 2011/0205708 A1 | 8/2011 | Andry et al. |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0048528 A1 | 3/2012 | Bergin et al. |
| 2012/0060826 A1 | 3/2012 | Weisenberger |
| 2012/0087094 A1 | 4/2012 | Hill et al. |
| 2012/0142832 A1 | 6/2012 | Varma et al. |
| 2012/0174956 A1 | 7/2012 | Smythe et al. |
| 2012/0182693 A1 | 7/2012 | Boday et al. |
| 2012/0195822 A1 | 8/2012 | Werner et al. |
| 2012/0253033 A1 | 10/2012 | Boucher et al. |
| 2012/0280382 A1 | 11/2012 | Im et al. |
| 2012/0285673 A1 | 11/2012 | Cola et al. |
| 2012/0288725 A1 | 11/2012 | Tanaka et al. |
| 2012/0292005 A1 | 11/2012 | Bruzda et al. |
| 2013/0127069 A1 | 5/2013 | Boday et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0285233 A1 | 10/2013 | Bao et al. |
| 2013/0288462 A1 | 10/2013 | Stender et al. |
| 2013/0299140 A1 | 11/2013 | Ling et al. |
| 2014/0043754 A1 | 2/2014 | Hartmann et al. |
| 2014/0190672 A1 | 7/2014 | Swaroop et al. |
| 2014/0264818 A1 | 9/2014 | Lowe et al. |
| 2015/0000151 A1 | 1/2015 | Roth et al. |
| 2015/0008361 A1 | 1/2015 | Hattori |
| 2015/0125646 A1 | 5/2015 | Tournilhac et al. |
| 2015/0138739 A1 | 5/2015 | Hishiki |
| 2015/0158982 A1 | 6/2015 | Saito et al. |
| 2015/0183951 A1 | 7/2015 | Bhagwagar et al. |
| 2015/0275060 A1 | 10/2015 | Kuroda et al. |
| 2015/0279762 A1 | 10/2015 | Lowe et al. |
| 2015/0307743 A1 | 10/2015 | Ireland et al. |
| 2016/0009865 A1 | 1/2016 | Jiang et al. |
| 2016/0160102 A1 | 6/2016 | Minegishi et al. |
| 2016/0160104 A1 | 6/2016 | Bruzda et al. |
| 2016/0226114 A1 | 8/2016 | Hartmann et al. |
| 2016/0272839 A1 | 9/2016 | Yamamoto et al. |
| 2017/0009362 A1 | 1/2017 | Werner et al. |
| 2017/0018481 A1 | 1/2017 | Zeng et al. |
| 2017/0107415 A1 | 4/2017 | Shiono |
| 2017/0137685 A1 | 5/2017 | Liu et al. |
| 2017/0167716 A1 | 6/2017 | Ezaki et al. |
| 2017/0226396 A1 | 8/2017 | Yang et al. |
| 2017/0243849 A1 | 8/2017 | Sasaki et al. |
| 2017/0317257 A1 | 11/2017 | Ezaki et al. |
| 2017/0321100 A1 | 11/2017 | Zhang et al. |
| 2018/0016404 A1 | 1/2018 | Tselepis et al. |
| 2018/0030327 A1 | 2/2018 | Zhang et al. |
| 2018/0030328 A1 | 2/2018 | Zhang et al. |
| 2018/0085977 A1 | 3/2018 | Ezaki |
| 2018/0194982 A1 | 7/2018 | Ezaki et al. |
| 2018/0267315 A1 | 9/2018 | Yonemura |
| 2018/0358283 A1 | 12/2018 | Zhang et al. |
| 2018/0370189 A1 | 12/2018 | Tang et al. |
| 2019/0048245 A1 | 2/2019 | Liu et al. |
| 2019/0078007 A1 | 3/2019 | Zhang et al. |
| 2019/0085225 A1 | 3/2019 | Zhang et al. |
| 2019/0092993 A1 | 3/2019 | Naik et al. |
| 2019/0119544 A1 | 4/2019 | Shen et al. |
| 2019/0122954 A1 | 4/2019 | Bruzda et al. |
| 2019/0249007 A1 | 8/2019 | Shen et al. |

FOREIGN PATENT DOCUMENTS

| | | |
|---|---|---|
| CN | 1407141 A | 4/2003 |
| CN | 1456710 A | 11/2003 |

(56) References Cited

FOREIGN PATENT DOCUMENTS

| | | |
|---|---|---|
| CN | 1549875 A | 11/2004 |
| CN | 1580116 A | 2/2005 |
| CN | 1638952 A | 7/2005 |
| CN | 1940007 A | 4/2007 |
| CN | 1970666 A | 5/2007 |
| CN | 1972988 A | 5/2007 |
| CN | 100351075 C | 11/2007 |
| CN | 101067030 A | 11/2007 |
| CN | 101113241 A | 1/2008 |
| CN | 101126016 A | 2/2008 |
| CN | 100394566 C | 6/2008 |
| CN | 101288353 A | 10/2008 |
| CN | 101445627 A | 6/2009 |
| CN | 101525489 A | 9/2009 |
| CN | 101090922 B | 8/2010 |
| CN | 101942197 A | 1/2011 |
| CN | 101735619 B | 11/2011 |
| CN | 102627943 A | 8/2012 |
| CN | 102634212 A | 8/2012 |
| CN | 101835830 B | 2/2013 |
| CN | 102348763 B | 4/2013 |
| CN | 103087389 A | 5/2013 |
| CN | 103102552 A | 5/2013 |
| CN | 103102689 A | 5/2013 |
| CN | 103214848 A | 7/2013 |
| CN | 103254647 A | 8/2013 |
| CN | 102134474 B | 10/2013 |
| CN | 103333447 A | 10/2013 |
| CN | 103709757 A | 4/2014 |
| CN | 103756631 A | 4/2014 |
| CN | 103773322 A | 5/2014 |
| CN | 103849356 A | 6/2014 |
| CN | 102341474 B | 9/2014 |
| CN | 104098914 A | 10/2014 |
| CN | 104136569 A | 11/2014 |
| CN | 104152103 A | 11/2014 |
| CN | 104194733 A | 12/2014 |
| CN | 104449550 A | 3/2015 |
| CN | 104471012 A | 3/2015 |
| CN | 104497574 A | 4/2015 |
| CN | 104513487 A | 4/2015 |
| CN | 103409116 B | 7/2015 |
| CN | 104804705 A | 7/2015 |
| CN | 104861661 A | 8/2015 |
| CN | 103436027 B | 10/2015 |
| CN | 105111750 A | 12/2015 |
| CN | 105349113 A | 2/2016 |
| CN | 105419339 A | 3/2016 |
| CN | 103131138 B | 5/2016 |
| CN | 104479623 B | 5/2016 |
| CN | 105566920 A | 5/2016 |
| CN | 105670555 A | 6/2016 |
| CN | 103923463 B | 8/2016 |
| CN | 105838322 A | 8/2016 |
| CN | 105925243 A | 9/2016 |
| CN | 105980512 A | 9/2016 |
| CN | 106221236 A | 12/2016 |
| CN | 106243720 A | 12/2016 |
| CN | 103865271 B | 4/2017 |
| CN | 104140678 B | 4/2017 |
| CN | 107057370 A | 8/2017 |
| DE | 102007037435 A1 | 2/2009 |
| DE | 102009001722 A1 | 9/2010 |
| EP | 0466188 A1 | 1/1992 |
| EP | 0519138 A2 | 12/1992 |
| EP | 0816423 A1 | 1/1998 |
| EP | 1099734 A1 | 5/2001 |
| EP | 1291913 A2 | 3/2003 |
| EP | 1414063 A2 | 4/2004 |
| EP | 1149519 B1 | 11/2004 |
| EP | 1514956 B1 | 11/2005 |
| EP | 1224669 B1 | 4/2006 |
| EP | 2194165 A1 | 6/2010 |
| EP | 1629059 B1 | 5/2012 |
| FR | 2848215 A1 | 6/2004 |
| GB | 2508320 B | 7/2014 |
| JP | 57-027188 B | 6/1982 |
| JP | 06-209057 A | 7/1994 |
| JP | 2611364 B2 | 5/1997 |
| JP | 2000-143808 A | 5/2000 |
| JP | 2001-139818 A | 5/2001 |
| JP | 2002-003830 A | 1/2002 |
| JP | 2003-218296 A | 7/2003 |
| JP | 2005-032468 A | 2/2005 |
| JP | 3662715 B2 | 6/2005 |
| JP | 2006-502248 A | 1/2006 |
| JP | 2007-002002 A | 1/2007 |
| JP | 2007-106809 A | 4/2007 |
| JP | 2007-131798 A | 5/2007 |
| JP | 4016326 B2 | 12/2007 |
| JP | 2008-063412 A | 3/2008 |
| JP | 2009-102577 A | 5/2009 |
| JP | 2009-138036 A | 6/2009 |
| JP | 4288469 B2 | 7/2009 |
| JP | 2009-292914 A | 12/2009 |
| JP | 2010-120979 A | 6/2010 |
| JP | 4480457 B2 | 6/2010 |
| JP | 2010-248277 A | 11/2010 |
| JP | 2010-248349 A | 11/2010 |
| JP | 2010-278115 A | 12/2010 |
| JP | 2011-144234 A | 7/2011 |
| JP | 2011-165792 A | 8/2011 |
| JP | 2012-119725 A | 6/2012 |
| JP | 2012-201106 A | 10/2012 |
| JP | 5137538 B2 | 2/2013 |
| JP | 5269366 B2 | 8/2013 |
| JP | 5318733 B2 | 10/2013 |
| JP | 5372270 B1 | 12/2013 |
| JP | 5390202 B2 | 1/2014 |
| JP | 5463116 B2 | 4/2014 |
| JP | 2014-105283 A | 6/2014 |
| JP | 2014-194006 A | 10/2014 |
| JP | 5607298 B2 | 10/2014 |
| JP | 5687167 B2 | 3/2015 |
| JP | 2015-212318 A | 11/2015 |
| JP | 2016-506992 A | 3/2016 |
| JP | 5944306 B2 | 7/2016 |
| JP | 2016-216523 A | 12/2016 |
| JP | 6323398 B2 | 5/2018 |
| JP | 2019-522711 A | 8/2019 |
| KR | 10-0479857 B1 | 3/2005 |
| KR | 10-0685013 B1 | 2/2007 |
| KR | 10-2007-0089169 A | 8/2007 |
| KR | 10-2007-0116654 A | 12/2007 |
| KR | 10-0820902 B1 | 4/2008 |
| KR | 0953679 B1 | 4/2010 |
| KR | 1175948 B1 | 8/2012 |
| KR | 10-2015-0049376 A | 5/2015 |
| KR | 10-2016-0130273 A | 11/2016 |
| TW | 569348 B | 1/2004 |
| TW | 200904959 A | 2/2009 |
| TW | 200907040 A | 2/2009 |
| TW | 201033268 A | 9/2010 |
| TW | 201527309 A | 7/2015 |
| TW | 201546257 A | 12/2015 |
| WO | 87/06492 A1 | 11/1987 |
| WO | 97/26297 A1 | 7/1997 |
| WO | 01/20618 A1 | 3/2001 |
| WO | 01/93648 A2 | 12/2001 |
| WO | 03/52818 A1 | 6/2003 |
| WO | 03/64148 A1 | 8/2003 |
| WO | 2004/001844 A2 | 12/2003 |
| WO | 2004/008497 A2 | 1/2004 |
| WO | 2004/022330 A1 | 3/2004 |
| WO | 2005/011146 A1 | 2/2005 |
| WO | 2005/021257 A1 | 3/2005 |
| WO | 2005/111146 A1 | 11/2005 |
| WO | 2005/119771 A1 | 12/2005 |
| WO | 2006/014171 A1 | 2/2006 |
| WO | 2006/023860 A2 | 3/2006 |
| WO | 2007/027670 A1 | 3/2007 |
| WO | 2008/014171 A2 | 1/2008 |
| WO | 2008/103219 A1 | 8/2008 |
| WO | 2008/121491 A1 | 10/2008 |

(56) References Cited

FOREIGN PATENT DOCUMENTS

| | | | |
|---|---|---|---|
| WO | 2008/121970 | A1 | 10/2008 |
| WO | 2009/032212 | A1 | 3/2009 |
| WO | 2010/104534 | A1 | 9/2010 |
| WO | 2010/104542 | A1 | 9/2010 |
| WO | 2013/074920 | A1 | 5/2013 |
| WO | 2013/129600 | A1 | 9/2013 |
| WO | 2013/168291 | A1 | 11/2013 |
| WO | 2013/191116 | A1 | 12/2013 |
| WO | 2014/007119 | A1 | 1/2014 |
| WO | 2014/021980 | A1 | 2/2014 |
| WO | 2014/160067 | A1 | 10/2014 |
| WO | 2015/120773 | A1 | 8/2015 |
| WO | 2015/131370 | A1 | 9/2015 |
| WO | 2015/179056 | A1 | 11/2015 |
| WO | 2016/004565 | A1 | 1/2016 |
| WO | 2016/103424 | A1 | 6/2016 |
| WO | 2016/111139 | A1 | 7/2016 |
| WO | 2018/022288 | A2 | 2/2018 |
| WO | 2018/022293 | A2 | 2/2018 |
| WO | 2018/068222 | A1 | 4/2018 |

OTHER PUBLICATIONS

"Semicosil 9212B." Wacker Silicones Material Safety Data Sheet, pp. 1-8, printed Dec. 11, 2009.
"Therm-A-Gap HCS10,569,570,579 and 580 Thermally Conductive Gap Filler Pads," Parker Chomerics, Engineering Your Success, pp. 11-12, available at least as early as the filing date of the present application.
Aranzabe, Estibaliz, et al. "More than Color: Pigments with Thermal Storage Capacity; Processing and Degradation Behavior." Advances in Materials Physics and Chemistry, 5:171-184, 2015.
Dow Corning.RTM. Two-Part RTV Silicone Sealant: Total Assembly Solutions for Home Appliance Production; www.dowcoming. com; Form No. 80-3375-01; 6 pages.
Evonik, Silanes for Adhesives and Sealants, 2013, p. 1-24.
Extended European Search Report issued in EP Application 14867847.7, dated Jun. 26, 2017, 7 pages.
Extended European Search Report issued in EP Application 15749120.0, dated Aug. 11, 2017, 6 pages.
Extended European Search Report issued in EP Application No. 14897036.1, dated Feb. 7, 2018, 7 pages.
Extended Search Report issued in EP Application 14907530.1, dated Jun. 27, 2018, 9 pages.
Fink, Johannes Karl. "Chapter 18: Metal Deactivators." in: A Concise Introduction to Additives for Thermoplastic Polymers, Wiley-Scrivener, pp. 165-171, Jan. 1, 2010.
Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-therrnal-interfa- ce-material/.
International Search Report and Written Opinion issued in PCT/CN2014/081724. dated Apr. 1, 2015, 12 pages.
International Search Report and Written Opinion issued in PCT/CN2014/093138, dated Sep. 6, 2015, 8 pages.
International Search Report and Written Opinion issued in PCT/CN2015/072202, dated Apr. 29, 2015, 14 pages.
International Search Report and Written Opinion issued in PCT/CN2016/075827, dated Dec. 1, 2016, 7 pages.
International Search Report and Written Opinion issued in PCT/CN2016/101874, dated Apr. 28, 2017, 12 pages.
International Search Report and Written Opinion issued in PCT/US2009/069090, dated Aug. 17, 2010, 6 pages.
International Search Report and Written Opinion issued in PCT/US2014/068033, dated Mar. 26, 2015, 12 pages.
International Search Report and Written Opinion issued in PCT/US2017/041498, dated Oct. 20, 2017, 10 pages.
International Search Report and Written Opinion issued in PCT/US2018/049218, dated Dec. 28, 2018, 13 pages.
International Search Report and Written Opinion issued in PCT/US2018/056870, dated Feb. 8, 2019, 9 pages.
International Search Report and Written Opinion received for PCT Patent Application No. PCT/US17/41447, dated Oct. 19, 2017, 10 pages.
International Search Report and Written Opinion received for PCT Patent Application No. PCT/US2018/049218, dated Dec. 28, 2018, 11 pages.
International Search Report and Written Opinion received for PCT Patent Application No. PCT/US2019/017743, dated May 28, 2019, 10 pages.
International Search Report and Written Opinion received for PCT Patent Application No. PCT/US2020/028908, dated Jul. 31, 2020, 11 pages.
Martyak et al., On the oxidation of tin(II) in methanesulfonate solutions and the role of sulfate, Gaivanotechnik (2005), 96(3), 594-601 (Abstract).
Ping, Ding, et al. "Preparation and Application Research of Novel Silicone Gel for High-Power IGBT." Insulating Materials, 47(2):52-55, Chinese text with English translation of Abstract, 2014.
Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.
Search Report issued in Chinese patent application 201410411725X (with English Translation), report dated Jul. 6, 2016, 4 pages.
Search Report issued in CN application 201480066502.2, dated May 18, 2017, 2 pages.
Singaporean Search Report and Written Opinion issued in SG Application No. 11201704238Y, dated May 18, 2018, 9 pages.
Singaporean Written Opinion issued in SG Application No. 11201704238Y, dated Apr. 11, 2019, 5 pages.
Singaporean Written Opinion issued in SG Application No. 11201704238Y, dated Feb. 7, 2019, 7 pages.
Wacker Silicones, Catalyst EP/Inhibitor PT 88 product data sheet, p. 1-3, Oct. 6, 2008.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp. 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp. 188-191.

* cited by examiner

GEL-TYPE THERMAL INTERFACE MATERIAL WITH LOW PRE-CURING VISCOSITY AND ELASTIC PROPERTIES POST-CURING

CROSS REFERENCE TO RELATED APPLICATION

This application claims priority to U.S. Provisional Application No. 62/837,442, filed Apr. 23, 2019, which is herein incorporated by reference in its entirety.

FIELD OF THE INVENTION

The present disclosure relates generally to thermal interface materials, and more particularly to gel-type thermal interface materials.

DESCRIPTION OF THE RELATED ART

Thermal interface materials (TIMs) are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

A typical electronics package structure 10 including thermal interface materials is illustrated in FIG. 1. The electronics package structure 10 illustratively includes a heat generating component, such as an electronic chip 12, and one or more heat dissipating components, such as a heat spreader 14, and a heat sink 16. Illustrative heat spreaders 14 and heat sinks comprise a metal, metal alloy, or metal-plated substrate, such as copper, copper alloy, aluminum, aluminum alloy, or nickel-plated copper. TIM materials, such as TIM 18 and TIM 20, provide a thermal connection between the heat generating component and the one or more heat dissipating components. Electronics package structure 10 includes a first TIM 18 connecting the electronic chip 12 and heat spreader 14. TIM 18 is typically referred to as a "TIM 1". Electronics package structure 10 includes a second TIM 20 connecting the heat spreader 14 and heat sink 16. TIM 20 is typically referred to as a "TIM 2". In another embodiment, electronics package structure 10 does not include a heat spreader 14, and a TIM (not shown) connects the electronic chip 12 directly to the heat sink 16. Such a TIM connecting the electronic chip 12 directly to the heat sink 16 is typically referred to as a TIM 1.5.

Traditional thermal interface materials include components such as gap pads. However, gap pads have certain disadvantages, such as inability to meet very small thickness requirements and being difficult to use in automated production.

Other thermal interface materials include gel products. Gel products may be automatically dispensed for large scale production and can be formed to desired shapes and thicknesses. However, typical curable thermal interface material/gel products with high thermal conductivities are not soft and are not elastic after curing due to high filler loading. Therefore, in certain environments where large vibrations and significant temperature changes are present, the thermal interface material/gel will peel off from the interface leading to degradation of thermal dissipation performance.

Improvements in the foregoing are desired.

SUMMARY OF THE INVENTION

The present disclosure provides thermal interface materials that are useful in transferring heat from heat generating electronic devices, such as computer chips, to heat dissipating structures, such as heat spreaders and heat sinks. The thermal interface material is soft and has elastic properties post-curing along with high thermally conductive filler loading. The thermal interface material includes at least one long chain alkyl silicone oil; at least one long chain, vinyl terminated alkyl silicone oil; at least one long chain, single end hydroxyl terminated silicone oil; at least one thermally conductive filler, at least one coupling agent, at least one catalyst, at least one crosslinker, and at least one addition inhibitor.

In one exemplary embodiment, a thermal interface material is provided. The thermal interface material includes a polymer matrix including: at least one long chain alkyl silicone oil; at least one long chain, vinyl terminated alkyl silicone oil; and at least one single end hydroxyl terminated silicone oil; wherein at least one of the long chain alkyl silicone oil; the long chain, vinyl terminated alkyl silicone oil; and the long chain, single end hydroxyl terminated silicone oil having at least one branch chain of between 4 and 16 alkyl carbons; and at least one thermally conductive filler. In a more particular embodiment, the long chain alkyl silicone oil has a general formula of:

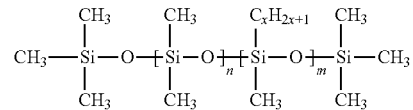

where n ranges from 0 to 5000, x ranges from 2 to 32, and m ranges from 5 to 2000, and n+m ranges from 50 to 5000. In a more particular embodiment, the long chain, vinyl terminated alkyl silicone oil has a general formula of:

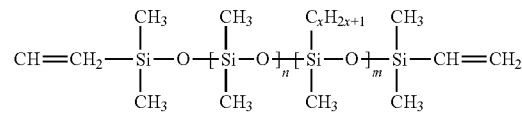

where n ranges from 0 to 5000, x ranges from 2 to 32, and m ranges from 5 to 5000, and n+m ranges from 50 to 10000. In a more particular embodiment, the long chain, single end hydroxyl terminated silicone oil has a general formula of:

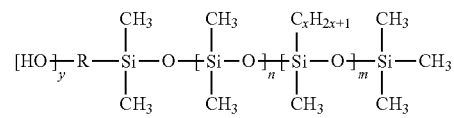

where R is an alkyl group, n ranges from 5 to 1000, x ranges from 2 to 32, y ranges from 1 to 3, m ranges from 0 to 500, and n+m ranges from 5 to 1000.

In a more particular embodiment, the long chain, single end hydroxyl terminated silicone oil has a hydroxyl value in the range of 1 mgKOH/g to 200 mgKOH/g. In another more particular embodiment, the thermally conductive filler includes at least a first thermally conductive filler and a second thermally conductive filler between 85 wt. % to 97 wt. %.

In still another more particular embodiment, the thermal interface material has a post cure recovery between 75% and 100% after 50% strain is applied for 2 hours at room temperature. In still another more particular embodiment, the thermal interface material comprises: from 0.5 wt. % to 5 wt. % of the long chain alkyl silicone oil; from 0.5 wt. % to 5 wt. % of the long chain, vinyl terminated alkyl silicone oil; from 0.5 wt. % to 2 wt. % of the long chain, single end hydroxyl terminated silicone oil; and from 50 wt. % to 95 wt. % of the thermally conductive filler. In a more particular embodiment, the thermal interface material has a hardness between 25 Shore OO and 50 Shore OO.

In a more particular embodiment of any of the above embodiments, a thermal interface material is provided. The thermal interface material comprises: a polymer matrix including: at least one long chain silicone oil having between 4 and 16 alkyl carbons; wherein the at least one long chain silicone oil includes: a long chain alkyl silicone oil; a long chain; vinyl terminated alkyl silicone oil; and a single end hydroxyl terminated silicone oil; an addition inhibitor; a crosslinker; a catalyst; a coupling agent; and at least one thermally conductive filler; wherein the thermal interface material comprises: from 3 wt. % to 15 wt. % of the polymer matrix; and from 50 wt. % to 95 wt. % of the thermally conductive filler. In a still more particular embodiment, the thermal interface material comprises: from 0.5 wt. % to 5 wt. % of the long chain alkyl silicone oil; from 0.5 wt. % to 5 wt. % of the long chain, vinyl terminated alkyl silicone oil; from 0.5 wt. % to 2 wt. % of the long chain, single end hydroxyl terminated silicone oil; from 0.01 wt. % to 0.5 wt. % of the catalyst; from 0.01 wt. % to 1 wt. % of the addition inhibitor; from 0.1 wt. % to 1 wt. % of the crosslinker; from 0.1 wt. % to 10 wt. % of the coupling agent; and from 50 wt. % to 95 wt. % of the thermally conductive filler. In a more particular embodiment of any of the above embodiments, the thermally conductive filler includes a first thermally conductive filler and a second thermally conductive filler, wherein the first thermally conductive filer is a metal oxide having a particle size greater than 10 microns and the second thermally conductive filler is a metal oxide having a particle size between 1 micron and 10 microns.

In a more particular embodiment of any of the above embodiments, the long chain alkyl silicone oil has a general formula of:

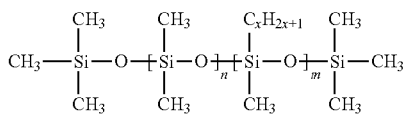

where n ranges from 0 to 5000, x ranges from 2 to 32, and m ranges from 5 to 2000, and n+m ranges from 50 to 5000. In a more particular embodiment of any of the above embodiments, the long chain, vinyl terminated alkyl silicone oil has a general formula of:

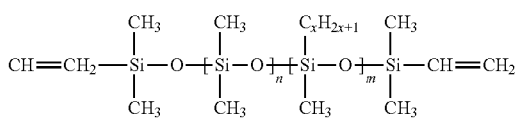

where n ranges from 0 to 5000, x ranges from 2 to 32, and m ranges from 5 to 5000, and n+m ranges from 50 to 10000. In a more particular embodiment of any of the above embodiments, the long chain, single end hydroxyl terminated silicone oil has a general formula of:

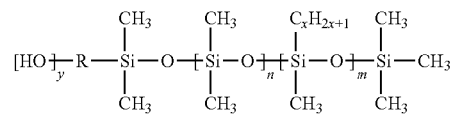

where R is an alkyl group, n ranges from 5 to 1000, x ranges from 2 to 32, y ranges from 1 to 3, m ranges from 0 to 500, and n+m ranges from 5 to 1000.

In one exemplary embodiment, an electronic component is provided. The electronic component comprises: a heat sink; an electronic chip; a thermal interface material having a first surface layer and a second surface layer, the thermal interface material positioned between the heat sink and electronic chip, the thermal interface material including: a polymer matrix including: at least one long chain silicone oil having between 4 and 16 alkyl carbons; wherein the at least one long chain silicone oil includes: a long chain alkyl silicone oil; a long chain; vinyl terminated alkyl silicone oil; and a single end hydroxyl terminated silicone oil; an addition inhibitor; a crosslinker; a catalyst; a coupling agent; and at least one thermally conductive filler; wherein the thermal interface material comprises: from 3 wt. % to 15 wt. % of the polymer matrix; and from 50 wt. % to 95 wt. % of the thermally conductive filler.

In a more particular embodiment, the long chain alkyl silicone oil has a general formula of:

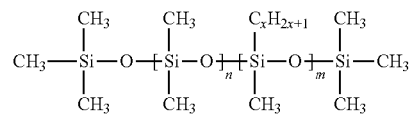

where n ranges from 0 to 5000, x ranges from 2 to 32, m ranges from 5 to 2000, and n+m ranges from 50 to 5000. In another more particular embodiment, the long chain, vinyl terminated alkyl silicone oil has a general formula of:

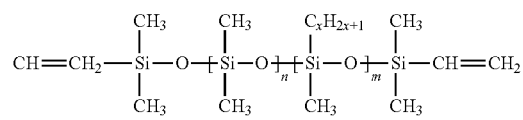

where n ranges from 0 to 5000, x ranges from 2 to 32, and m ranges from 5 to 5000, and n+m ranges from 50 to 10000. In another more particular embodiment, the long chain, single end hydroxyl terminated silicone oil has a general formula of:

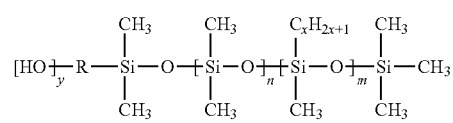

where R is an alkyl group, n ranges from 5 to 1000, x ranges from 2 to 32, y ranges from 1 to 3, m ranges from 0 to 500, and n+m ranges from 5 to 1000.

In a more particular embodiment, the first surface layer is in contact with a surface of the electronic chip and the second surface layer is in contact with the heat sink. In a more particular embodiment, the electronic component further comprises a heat spreader positioned between the heat sink and the electronic chip, wherein the first surface layer is in contact with a surface of the electronic chip and the second surface layer is in contact with the heat spreader. In a more particular embodiment, the electronic component further comprises a heat spreader positioned between the heat sink and the electronic chip, wherein the first surface layer is in contact with a surface of the heat spreader and the second surface layer is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Interface Material

Figure 1:
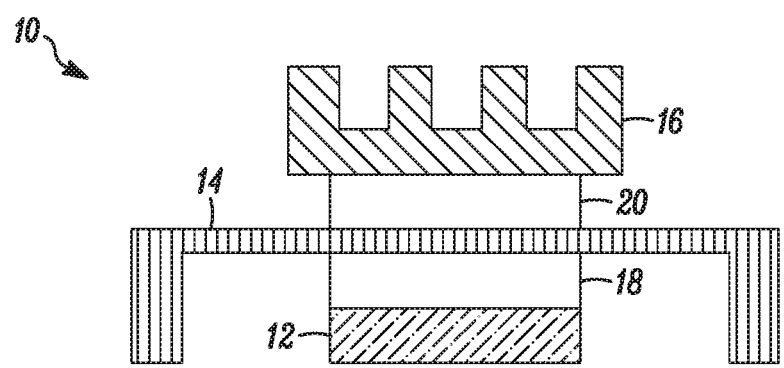
FIG. 1 schematically illustrates a typical electronics package structure.
Figure 2:
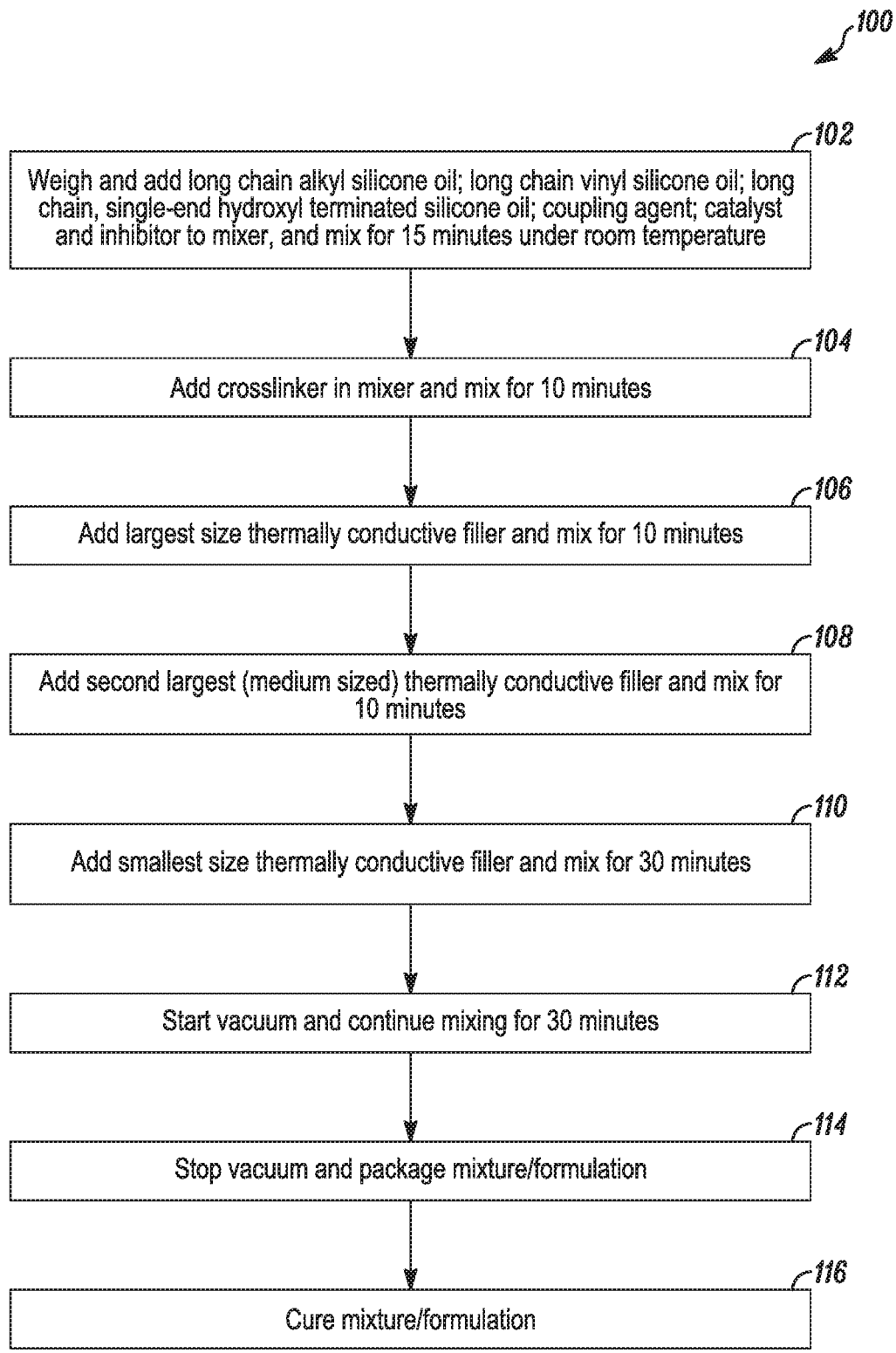
FIG. 2 is a flowchart illustrating a method of making a thermal interface material in accordance with the present disclosure.
Figure 3A:
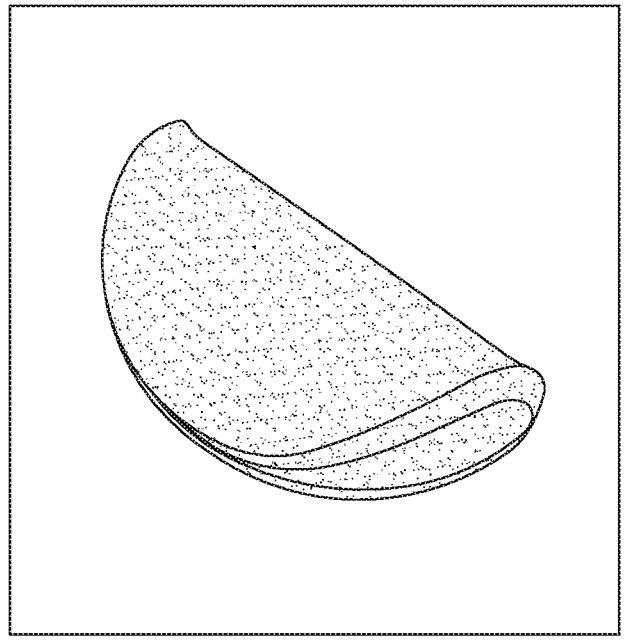
FIG. 3A is related to Example 1 and shows the sample of Example 1 when a compression force is applied.
Figure 3B:
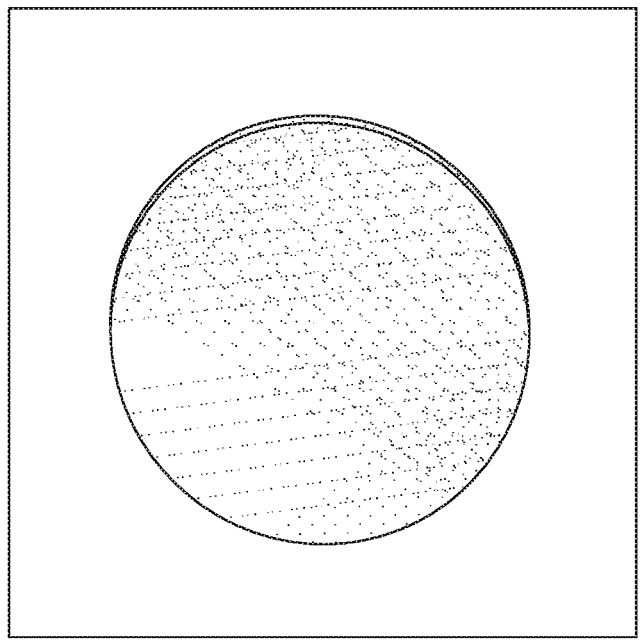
FIG. 3B is related to Example 1 and shows the sample of Example 1 in recovery after the compression force is removed.

The present disclosure provides thermal interface materials that are useful in transferring heat from heat generating electronic devices, such as computer chips, to heat dissipating structures, such as heat spreaders and heat sinks. The thermal interface material is soft and has elastic properties post-curing along with high thermally conductive filler loading. The thermal interface material includes at least one long chain alkyl silicone oil; at least one long chain, vinyl terminated alkyl silicone oil; at least one long chain, single end hydroxyl terminated silicone oil; at least one thermally conductive filler, at least one coupling agent, at least one catalyst, at least one crosslinker, and at least one addition inhibitor. For the purposes of the present disclosure, "long chain" includes an alkyl branch extending from the main chain; the alkyl branch ranging from 4 to 16 carbon atoms.

1. Silicone Oil a. General Description

The present disclosure provides a matrix for a TIM material that includes at least one long chain silicone oil. The silicone oil includes one or more crosslinkable groups, such as vinyl and hydride functional groups, that are crosslinked by a catalyst. In one embodiment, one or more long chain silicone oils include a first long chain silicone oil, a second long chain silicone oil, and a third long chain silicone oil, where the first long chain silicone oil is a long chain alkyl silicone oil, the second long chain silicone oil is a long chain, vinyl terminated alkyl silicone oil, and the third long chain silicone oil is a long chain, single-end hydroxyl terminated silicone oil. The silicone oil wets the thermally conductive filler and forms a dispensable fluid for the TIM.

In one exemplary embodiment, the silicone oil includes a silicone rubber such as the KE series products available from Shin-Etsu, such as SILBIONE® available from Bluestar, such as ELASTOSIL®, SilGel®, SILPURAN®, and SEMICOSIL® available from Wacker, such as Silopren® available from Momentive, such as Dow Corning®, Silastic®, XIAMETER®, Syl-Off® and SYLGARD® available from Dow Corning, such as SQUARE® available from Square Silicone, such as Andril® available from AB specialty Silicones. Other polysiloxanes are available from Wacker, Shin-etsu, Dowcoring, Momentive, Bluestar, RUNHE, AB Specialty Silicones, Gelest, and United Chemical Technologies.

The TIM may comprise one or more long chain silicone oils in a total amount as little as 3 wt. %, 4 wt. %, 5 wt. %, as great as 10 wt. %, 12.5 wt. %, 15 wt. %, or within any range defined between any two of the foregoing values, based on the total weight of the TIM, such as 3 wt. % to 15 wt. %, 4 wt. % to 12.5 wt. %, or 5 wt. % to 10 wt. %. In one exemplary embodiment, the TIM includes at least one long chain silicone oil in the amount of about 7.2 wt. %. In another exemplary embodiment, the TIM includes at least one long chain silicone oil in the amount of about 5 wt. %.

As discussed herein, the "long chain" silicone oils include at least one branched chain or an alkyl branched chain that extends from the main chain and vary in number of carbons. The alkyl branches have a general formula of:

$C_xH_{2x+1}$ where x is an integer greater than 1. In some embodiments, x is as low as 2, 4, 6, 8, 10, 12, as great as 16, 18, 20, 24, 28, 32, or within any range defined between any two of the foregoing values, such as between 2 and 32, between 6 and 16, and between 4 and 12. The branched silicone oil can achieve a lower viscosity with less molecular chain entanglement compared with silicone oils having the same molecular weight without the alkyl branch. The lower viscosity helps to achieve high loading of the thermally conductive fillers in the thermal interface materials formulation especially for high molecular weight silicone oils (i.e., a higher molecular weight means longer Si—O—Si chain and greater molecular chain entanglement).

b. Long Chain Alkyl Silicone Oil

The TIM includes a long chain alkyl silicone oil. The long chain alkyl silicone oil provides lubricity between molecular chains and decreases entanglement of the molecular chains of the formulation. Exemplary long chain alkyl silicone oils may be a kind of simethicone whose partial methyl groups are replaced by a long chain alkyl group. Exemplary long chain alkyl silicone oils may have a general formula as shown below:

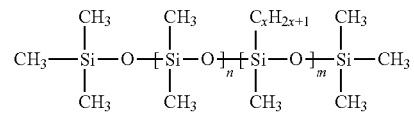

In the general formula shown above, n ranges from as little as 0, 10, 50, 100, 500, as great as 1000, 2000, 5000, 10000, or within any range defined between any two of the foregoing values; x is as low as 2, 4, 6, 8, 10, 12, as great as 16, 18, 20, 24, 28, 32, or within any range defined between any two of the foregoing values, such as between 2 and 32, between 6 and 16, and between 4 and 12, and m ranges from 5, 10, 50, 200, or as great as 500, 1000, 2000, 5000, or within any range defined between any two of the foregoing values. In addition, n+m ranges from as little as 10, 30, 50, 100, 200, 500, or great as 1000, 2000, 5000, 10000, 15000, or within any range defined between any two of the foregoing values, such as between 10 and 15000, between 1000 and 5000 and between 500 and 2000. In one exemplary embodiment, x ranges from between 4 and 16. In another exemplary embodiment, x ranges from between 5 and 15. In another exemplary embodiment, x ranges from between 7 and 11. In one exemplary embodiment, n ranges from between 50 and 100. In another exemplary embodiment, n ranges from between 100 and 500. In another exemplary embodiment, n ranges from between 500 and 1000. In one exemplary embodiment, m ranges from between 10 and 100. In another exemplary embodiment, m ranges from between 100 and 500. In one exemplary embodiment, n+m ranges from between 50 and 200. In another exemplary embodiment, n+m ranges from between 200 and 1000.

Exemplary long chain alkyl silicone oils include: BALD-BD1206 (the viscosity is 500 cst) is available from Baoerde, RH-8206 (the viscosity is 900 cst~1500 cst) and RH-8207A (the viscosity is 1000 cst~1500 cst) each is available from Runhe, YD-8206 (the viscosity is 300~2500 cst) is available from Ailidi, OFX0203 (the viscosity is 1000 cst~1500 cst) is available from Dow corning, BS-220 (the viscosity is 5000 cst) is available from Blue silane.

Exemplary long chain alkyl silicone oils may have a weight ($M_w$) average molecular weight as little as 1000 Daltons, 9000 Daltons, 20000 Daltons, as great as 30000 Daltons, 100000 Daltons, 200000 Daltons, or within any range defined between any two of the foregoing values, as determined by Gel Permeation Chromatography (GPC).

Exemplary long chain alkyl silicone oils may have a kinematic viscosity as little as 10 cSt, 100 cSt, 500 cSt, as great as 5000 cSt, 50000 cSt, 100000 cSt, or within any range defined between any two of the foregoing values as measured according to ASTM D445. In one exemplary embodiment, an exemplary long chain alkyl silicone oil has a kinematic viscosity of between 400 cSt and 600 cSt. In another exemplary embodiment, an exemplary long chain alkyl suilicone oil has a kinematic viscosity of between 500 cSt and 1000 cSt.

The TIM may comprise one or more long chain alkyl silicone oils in an amount as little as 0.5 wt. %, 0.75 wt. %, 1 wt. %, as great as 2 wt. %, 3.5 wt. %, 5 wt. %, or within any range defined between any two of the foregoing values, based on the total weight of the TIM, such as 0.5 wt. % to 5 wt. %, 0.75 wt. % to 3.5 wt. %, or 1 wt. % to 3.5 wt. %. In one exemplary embodiment, the TIM includes a long chain alkyl silicone oil in the amount of about 3 wt. %. In another exemplary embodiment, the TIM includes a long chain alkyl silicone oil in the amount of about 2 wt. %.

c. Long Chain, Vinyl Terminated Alkyl Silicone Oil

Another exemplary long chain silicone oil of the TIM may include a long chain, vinyl terminated alkyl silicone oil. The long chain, vinyl terminated alkyl silicone oil can form a cross linked matrix with a cross linker via its terminated vinyl functional groups. Exemplary long chain, vinyl terminated alkyl silicone oils may have a general formula shown below:

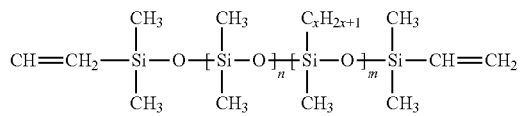

In the general formula shown above, n ranges from as little as 0, 10, 50, 100, 200, 500, as great as 1000, 2000, 5000, 10000, or within any range defined between any two of the foregoing values; x is as low as 2, 4, 6, 8, 10, 12, as great as 16, 18, 20, 24, 28, 32, or within any range defined between any two of the foregoing values, such as between 2 and 32, between 6 and 16, and between 4 and 12, and m ranges from 5, 10, 50, 200, or as great as 500, 1000, 2000, 5000, or within any range defined between any two of the foregoing values. In addition, n+m ranges from as little as 10, 30, 50, 100, 200, 500, or great as 1000, 2000, 5000, 10000, 15000, 20000, or within any range defined between any two of the foregoing values, such as between 10 and 20000, between 1000 and 5000 and between 500 and 2000. In one exemplary embodiment, x ranges from between 4 and 16. In another exemplary embodiment, x ranges from between 5 and 15. In another exemplary embodiment, x ranges from between 7 and 11. In one exemplary embodiment, n ranges from between 200 and 500. In another exemplary embodiment, n ranges from between 1000 and 3000. In another exemplary embodiment, n ranges from between 2000 and 5000. In one exemplary embodiment, m ranges from between 150 and 300. In another exemplary embodiment, m ranges from between 300 and 500. In another exemplary embodiment, m ranges from between 500 and 1500. In one exemplary embodiment, n+m ranges from between 200 and 1000. In another exemplary embodiment, n+m ranges from between 1000 and 5000. In another exemplary embodiment, n ranges from between 50 and 200.

Vinyl functional silicone oils include an organo-silicone component with Si—CH═CH$_2$ groups. Exemplary vinyl functional silicone oils include vinyl-terminated silicone oils and vinyl-grafted silicone oils in which the Si—CH═CH$_2$ group is grafted onto the polymer chain, and combinations thereof.

Exemplary vinyl-terminated silicone oils include vinyl terminated polydimethylsiloxane, such as DMS-V00 (having a weight average molecular weight ($M_w$) of 186 Daltons), DMS-V03 (having a $M_w$ of about 500 Daltons), DMS-V05 (having a $M_w$ of about 800 Daltons), DMS-V21 (having a $M_w$ of about 6,000 Daltons), DMS-V22 (having a $M_w$ of about 9400 Daltons), DMS-V25 (having a $M_w$ of about 17,200 Daltons), DMS-V25R (having a $M_w$ of about 17,200 Daltons), DMS-V35 (having a $M_w$ of about 49,500 Daltons), DMS-V35R (having a $M_w$ of about 49,500 Daltons), each available from Gelest, Inc. Exemplary vinyl-terminated silicone oils include vinyl terminated diphenylsiloxane-dimethylsiloxane copolymer, such as PDV-0325 (having a $M_w$ of about 15,500 Daltons), PDV-0331 (having a $M_w$ of about 27,000 Daltons), PDV-0525 (having a $M_w$ of about 14,000 Daltons), PDV-1625 (having a $M_w$ of about 9,500 Daltons), PDV-1631 (having a $M_w$ of about 19,000 Daltons), PDV-2331 (having a $M_w$ of about 12,500 Daltons), each available from Gelest, Inc. Exemplary vinyl-terminated silicone oils include vinyl terminated polyphenylmethylsiloxane, such as PMV-9925 (having a $M_w$ of about 2000-3000 Daltons) available from Gelest, Inc. Exemplary vinyl-terminated silicone oils include vinyl terminated diethylsiloxane-dimethylsiloxane copolymer, such as EDV-2025 (having a $M_w$ of about 16,500-19,000 Daltons) available from Gelest, Inc.

Exemplary vinyl-terminated silicone oils include vinyl terminated polydimethylsiloxane, such as DMS-V41 (having a $M_w$ of about 62,700 Daltons), DMS-V42 (having a $M_w$ of about 72,000 Daltons), DMS-V46 (having a $M_w$ of about 117,000 Daltons), DMS-V51 (having a $M_w$ of about 140,000

Daltons), and DMS-V52 (having a $M_w$ of about 155,000 Daltons), each available from Gelest, Inc.

Exemplary vinyl-grafted silicone oils include vinylmethylsiloxane homopolymers, such as VMS-005 (having a $M_w$ of about 258-431 Daltons), VMS-T11 (having a $M_w$ of about 1000-1500 Daltons), both available from Gelest, Inc. Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers, including a vinylmethylsiloxane-octylmethylsiloxane-dimethylsiloxane terpolymer, such as VAT-4326(having a $M_w$ of about 10,000-12,000 Daltons), or a vinylmethylsiloxane-methoxypolyethylenoxypropylmethylsiloxane-dimethylsiloxane terpolymer, such as VBT-1323(having a $M_w$ of about 8,000-12,000 Daltons), or a vinylmethylsiloxane-phenylmethylsiloxane-dimethylsiloxane (having a $M_w$ of about 2,500-3,000 Daltons); each available from Gelest, Inc. Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers. In one exemplary embodiment, the vinyl-functional silicone oil comprises a vinyl T resin or a vinyl Q resin.

In one exemplary embodiment, the silicone oil is a vinyl functional oil, such as RH-Vi303, RH-Vi301 from RUNHE, such as Andril® VS 200, Andril® VS 1000 from AB Specialty Silicones.

Exemplary long chain, vinyl terminated alkyl silicone oils may have a weight ($M_w$) average molecular weight as little as 1000 Daltons, 9000 Daltons, 20000 Daltons, as great as 30000 Daltons, 100000 Daltons, 200000 Daltons, or within any range defined between any two of the foregoing values, as determined by Gel Permeation Chromatography (GPC).

Exemplary long chain, vinyl terminated alkyl silicone oils may have a kinematic viscosity as little as 10 cSt, 100 cSt, 500 cSt, as great as 5000 cSt, 50000 cSt, 100000 cSt, or within any range defined between any two of the foregoing values as measured according to ASTM D445. In one exemplary embodiment, an exemplary long chain, vinyl terminated alkyl silicone oil has a kinematic viscosity of 2000 cSt. In another exemplary embodiment, an exemplary long chain, vinyl terminated alkyl silicone oil has a kinematic viscosity of 1000 cSt. In another exemplary embodiment, an exemplary long chain, vinyl terminated alkyl silicone oil has a kinematic viscosity of 5000 cSt.

The TIM may comprise one or more long chain, vinyl terminated alkyl silicone oils in an amount as little as 0.5 wt. %, 0.75 wt. %, 1 wt. %, as great as 2 wt. %, 3.5 wt. %, 5 wt. %, or within any range defined between any two of the foregoing values, based on the total weight of the TIM, such as 0.5 wt. % to 5 wt. %, 0.75 wt. % to 3.5 wt. %, or 1 wt. % to 3.5 wt. %. In one exemplary embodiment, the TIM includes a long chain, vinyl terminated alkyl silicone oil in the amount of about 3 wt. %. In another exemplary embodiment, the TIM includes a long chain, vinyl terminated alkyl silicone oil in the amount of about 2 wt. %.

d. Long Chain, Single End Hydroxyl Terminated Silicone Oil

Another exemplary long chain silicone oil of the TIM may include a long chain, single end hydroxyl terminated silicone oil. The single end hydroxyl functional group provides good wetting on the thermally conductive fillers, and the end of the long chain silicon oil helps to improve the compatibility with other silicone oils in the present formulation. Also, the long chain silicone oil decreases potential evaporation of the silicone oil during curing or other processing of the formulation. Based on such functions, the long chain, single end hydroxyl terminated silicone oil can decrease the friction between thermally conductive fillers. Exemplary long chain, single end hydroxyl terminated silicone oils may have a general formula as shown below:

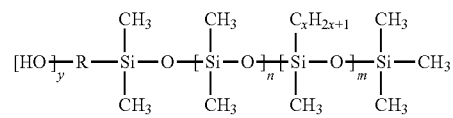

In the general formula shown above, n ranges from as little as 5, 10, 50, 100, 500, as great as 1000, 2000, 5000, 10000, or within any range defined between any two of the foregoing values; x is as low as 2, 4, 6, 8, 10, 12, as great as 16, 18, 20, 24, 28, 32, or within any range defined between any two of the foregoing values, such as between 2 and 32, between 6 and 16, and between 4 and 12, and m ranges from 0, 5, 10, 50, 100, 200, or as great as 500, 1000, 2000, 5000, or within any range defined between any two of the foregoing values, such as between 5 and 5000, between 5 and 50, and between 50 and 500. In addition, n+m ranges from as little as 10, 30, 50, 100, 200, 500, or great as 1000, 2000, 5000, 10000, 15000, or within any range defined between any two of the foregoing values, such as between 10 and 10000, between 1000 and 5000 and between 500 and 2000. In one exemplary embodiment, x ranges from between 4 and 16. In another exemplary embodiment, x ranges from between 5 and 15. In another exemplary embodiment, x ranges from between 7 and 11. In one exemplary embodiment, n ranges from between 10 and 100. In another exemplary embodiment, n ranges from between 100 and 500. In another exemplary embodiment, n ranges from between 500 and 2000. In another exemplary embodiment, n ranges from between 2000 and 5000. In another exemplary embodiment, n ranges from between 5000 and 10000. In one exemplary embodiment, m is 0. In another exemplary embodiment, m ranges from between 1 and 20. In another exemplary embodiment, m ranges from between 10 and 100. In another exemplary embodiment, m ranges from between 50 and 500, y is ranges from between 1 and 3, and R is hydrocarbon group. When the molecular weight of the single end hydroxyl terminated silicone oil is not higher than 10000 Daltons, or the loading of single end hydroxyl terminated silicone oil into the final thermal interface materials is not higher than 2 wt. % and m can be 0. In one exemplary embodiment, m+n ranges from between 10 and 100. In another exemplary embodiment, m+n ranges from between 100 and 500 In another exemplary embodiment, m+n ranges from between 500 and 2000. In another exemplary embodiment, m+n ranges from between 2000 and 5000. In another exemplary embodiment, m+n ranges from between 5000 and 10000.

Hydroxyl value is a measure of the content of free hydroxyl groups in a chemical substance, usually expressed in units of mass of potassium hydroxide (KOH), in milligrams, equivalent to the hydroxyl content of one gram of the chemical substance. In a general analytical method, the hydroxyl value (mg KOH/g) is defined as the mass of potassium hydroxide, in milligrams, required to neutralize the acetic acid undergoing taken up on acetylation of one gram of the long chain, single end hydroxyl terminated silicone oils. The traditional, analytical method used to determine hydroxyl value involves acetylation of the free hydroxyl groups of the substance with acetic anhydride in a pyridine solvent. After completion of the reaction, water is added, and the remaining unreacted acetic anhydride is converted to acetic acid and measured by titration with potassium hydroxide. The hydroxyl value can be calculated using the following equation below.

$$HV=[56.1*N*(V_B-V_{acet})]/W_{acet}$$

where HV is the hydroxyl value; $V_B$ is the amount (mL) of potassium hydroxide solution required for the titration of the blank; $V_{acet}$ is the amount (mL) of potassium hydroxide solution required for the titration of the acetylated sample; $W_{acet}$ is the weight of sample (in grams) used for acetylation; N is the normality of the titrant; 56.1 is the molecular weight of potassium hydroxide.

Exemplary long chain, single end hydroxyl terminated silicone oils may have a hydroxyl value as little as 0.001 mg KOH/g, 0.01 mgKOH/g, 0.1 mgKOH/g, 1 mgKOH/g, 5 mgKOH/g, as great as 10 mgKOH/g, 20 mgKOH/g, 50 mgKOH/g, 100 mgKOH/g, or within any range defined between any two of forgoing values, such as 0.01 mgKOH/g to 100 mgKOH/g, 1 mgKOH/g to 5 mgKOH/g, 1 mgKOH/g to 50 mgKOH/g, as determined by general KOH (potassium hydroxide) titration method. In one exemplary embodiment, an exemplary long chain, single end hydroxyl terminated silicone oil has a hydroxyl value range of 5 mgKOH/g to 35 mgKOH/g.

Exemplary long chain, single end hydroxyl terminated silicone oils may have a weight ($M_w$) average molecular weight as little as 500 Daltons, 2000 Daltons, 5000 Daltons, as great as 6000 Daltons, 50000 Daltons, 100000 Daltons, or within any range defined between any two of the foregoing values, as determined by Gel Permeation Chromatography (GPC).

Exemplary long chain, single end hydroxyl terminated silicone oils may have a kinematic viscosity as little as 10 cSt, 100 cSt, 300 cSt, as great as 500 cSt, 1000 cSt, 5000 cSt, or within any range defined between any two of the foregoing values as measured according to ASTM D445. In one exemplary embodiment, an exemplary long chain, single end hydroxyl terminated silicone oil has a kinematic viscosity between 100 cSt and 150 cSt.

The TIM may comprise one or more long chain, single end hydroxyl terminated silicone oils in an amount as little as 0.5 wt. %, 0.67 wt. %, 0.75 wt. %, as great as 1 wt. %, 1.25 wt. %, 2 wt. %, or within any range defined between any two of the foregoing values, based on the total weight of the TIM, such as 0.5 wt. % to 2 wt. %, 0.75 wt. % to 1.25 wt. %, or 1 wt. % to 1.25 wt. %. In one exemplary embodiment, the TIM includes a long chain, single end hydroxyl terminated silicone oil in the amount of about 1 wt. %. In another exemplary embodiment, the TIM includes a long chain, single end hydroxyl terminated silicone oil in the amount of about 1.2 wt. %.

2. Catalyst

The TIM further includes one or more catalyst for catalyzing the addition reaction. Exemplary catalysts comprise platinum containing materials and rhodium containing materials. Exemplary platinum containing catalysts may have the general formula shown below:

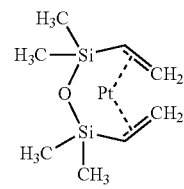

Exemplary platinum containing catalysts include: platinum cyclovinylmethylsiloxane complex (Ashby Karstedt Catalyst), platinum carbonyl cyclovinylmethylsiloxane complex (Ossko catalyst), platinum divinyltetramethyldisiloxane dimethyl fumarate complex, platinum divinyltetramethyldisiloxane dimethyl maleate complex and the like. Exemplary platinum carbonyl cyclovinylmethylsiloxane complexes include SIP6829.2, exemplary platinum divinyltetramethyldisiloxane complexes include SIP6830.3 and SIP6831.2, exemplary platinum cyclovinylmethylsiloxane complexes include SIP6833.2, all available from Gelest, Inc. Further exemplary platinum containing material catalysts include Catalyst OL available from Wacker Chemie AG, and PC065, PC072, PC073, PC074, PC075, PC076, PC085, PC086, PC087, PC088 available from United Chemical Technologies Inc.

Exemplary rhodium containing materials include Tris (dibutylsulfide)rhodium trichloride with product code INRH078, available from Gelest, Inc.

Without wishing to be held to any particular theory it is believed that the platinum catalyst reacts with a vinyl silicone oil and a hydrosilicone oil.

The TIM may comprise the one or more catalyst in an amount as little as 5 ppm, 10 ppm, 15 ppm, 20 ppm, as great as 25 ppm, 30 ppm, 40 ppm, 50 ppm, 100 ppm, 200 ppm, 500 ppm, 1000 ppm, or within any range defined between any two of the foregoing values, based on the total weight of the silicone oil, such as 10 ppm to 30 ppm, 20 ppm to 100 ppm, or 5 ppm to 500 ppm.

In one exemplary embodiment, the catalyst is provided as a mixture with one or more of the silicone oils. In one exemplary embodiment, the platinum containing material catalyst is combined to a functional silicone oil, such as KE-1012-A, KE-1031-A, KE-109E-A, KE-1051J-A, KE-1800T-A, KE1204A, KE1218A available from Shin-Etsu, such as SILBIONE® RT Gel 4725 SLD A available from Bluestar, such as SilGel® 612 A, ELASTOSIL® LR 3153A, ELASTOSIL® LR 3003A, ELASTOSIL® LR 3005A, SEMICOSIL® 961A, SEMICOSIL® 927A, SEMICOSIL® 205A, SEMICOSIL® 9212A, SILPURAN® 2440 available from Wacker, such as Silopren® LSR 2010A available from Momentive, such as XIAMETER® RBL-9200 A, XIAMETER® RBL-2004 A, XIAMETER® RBL-9050 A, XIAMETER® RBL-1552 A, Silastic® FL 30-9201 A, Silastic® 9202 A, Silastic® 9204 A, Silastic® 9206 A, SYLGARD® 184A, Dow Corning® QP-1 A, Dow Corning® C6 A, Dow Corning® CV9204 A available from Dow Corning.

An exemplary catalyst includes chloroplatinic acid.

The TIM may comprise a catalyst in an amount as little as 0.01 wt %, 0.1 wt. %, 0.2 wt. %, as great as 0.3 wt. %, 0.4 wt. %, 0.5 wt. %, or within any range defined between any two of the foregoing values, based on the total weight of the TIM. In one exemplary embodiment, the TIM includes a catalyst in the amount of about 0.01 wt. %.

3. Addition Inhibitor

The TIM comprises one or more addition inhibitors for inhibiting or limiting crosslinking of the silicone oils. The addition inhibitor includes at least one alkynyl compound, and optionally, the addition inhibitor further includes a multi-vinyl functional polysiloxane.

Exemplary addition inhibitors include acetylenic alcohols such as 1-ethynyl-1-cyclohexanol, 2-methyl-3-butyn-2-ol, 2-phenyl-3-butyn-2-ol, 2-ethynyl-isopropanol, 2-ethynyl-butane-2-ol, and 3,5-dimethyl-1-hexyn-3-ol; silylated acetylenic alcohols such as trimethyl (3,5-dimethyl-1-hexyn-3-oxy)silane, dimethyl-bis-(3-methyl-1-butyn-oxy)silane, methylvinylbis(3-methyl-1-butyn-3-oxy)silane, and ((1,1-dimethyl-2-propynyl)oxy)trimethylsilane; unsaturated carboxylic esters such as diallyl maleate, dimethyl maleate, diethyl fumarate, diallyl fumarate, and bis-2-methoxy-1-methylethylmaleate, mono-octylmaleate, mono-isooctylmaleate, mono-allyl maleate, mono-methyl maleate, mono-ethyl fumarate, mono-allyl fumarate, 2-methoxy-1-methylethylmaleate; fumarate/alcohol mixtures, such as mixtures where the alcohol is selected from benzyl alcohol or 1-octanol and ethenyl cyclohexyl-1-ol; conjugated eneynes such as 2-isobutyl-1-butene-3-yne, 3,5-dimethyl-3-hexene-1-yne, 3-methyl-3-pentene-1-yne, 3-methyl-3-hexene-1-yne, 1-ethynylcyclohexene, 3-ethyl-3-butene-1-yne, and 3-phenyl-3-butene-1-yne; vinylcyclosiloxanes such as 1,3,5,7-tetramethyl-1,3,5,7-tetravinylcyclotetrasiloxane, and mixtures of conjugated ene-yne and vinylcyclosiloxane. In one exemplary embodiment, the addition inhibitor is selected from 2-methyl-3-butyn-2-ol or 3-methyl-1-pentyn-3-ol.

In some exemplary embodiments, the addition inhibitor further includes a multi-vinyl functional polysiloxane. An exemplary multi-vinyl functional polysiloxane is a vinyl terminated polydimethylsiloxane in ethynyl cyclohexanol, such as Pt Inhibitor 88 available from Wacker Chemie AG. Without wishing to be held to any particular theory it is believed that the platinum catalyst forms a complex with ethynyl cyclohexanol and vinyl terminated polydimethylsiloxane as shown below.

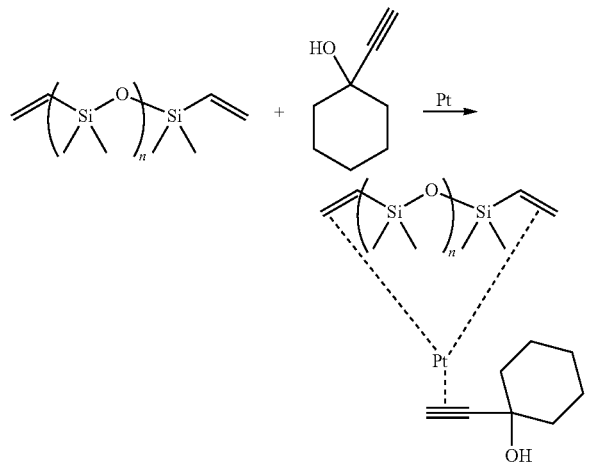

The formation of the complex is believed to decrease the catalyst activity at room temperature, thus maintaining the dispensability and wettability of the TIM. At the higher temperatures of the curing step, the Pt is released from the complex and help the hydrosilylation of vinyl functional silicone oil and hydride functional silicone oil, provides greater control over the crosslinking.

In some exemplary embodiments, the TIM may comprise the one or more addition inhibitors in an amount as little as 0.01 wt. %, 0.02 wt. %, 0.05 wt. %, 0.1 wt. %, 0.15 wt. %, as great as 0.2 wt. %, 0.25 wt. %, 0.3 wt. %, 0.5 wt. %, 1 wt. %, 3 wt. %, 5 wt. %, or within any range defined between any two of the foregoing values, based on the total weight of the TIM, such as 0.01 wt. % to 1 wt. %, 0.01 wt. % to 0.5 wt. %, or 0.05 wt. % to 0.2 wt. %. In one exemplary embodiment, the TIM includes an addition inhibitor in the amount of 0.018 wt. %. In another exemplary embodiment, the TIM includes an addition inhibitor in the amount of 0.02 wt. %.

Without wishing to be held to any particular theory, it is believed that, in the absence of an addition inhibitor, the vinyl functional silicone oil reacts with the hydride functional silicone oil very quickly based on the addition hydrosilylation mechanism to form a solid phase that cannot be automatically dispensed by typical methods.

In one exemplary embodiment, the addition inhibitor is combined to functional silicone oils, such as KE-1056, KE-1151, KE-1820, KE-1825, KE-1830, KE-1831, KE-1833, KE-1842, KE-1884, KE-1885, KE-1886, FE-57, FE-61 available from Shin-Etsu, such as Syl-Off® 7395, Syl-Off® 7610, Syl-Off® 7817, Syl-Off® 7612, Syl-Off® 7780 available from Dow Corning.

4. Cross-Linking Silicone Oil (Crosslinker)

The thermal gel may further include a cross linking silicone oil. The cross linking silicone oil may include Si—H groups. Exemplary silicone oils include a hydrosilicone oil having a general formula as shown below. Exemplary hydrosilicone oils function as a cross linker in the addition reaction with the primary silicone oils.

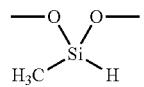

The mole ratio of Si—H groups in cross linking silicone oil is tested by iodometric titration. Iodometric titration includes: weighing about 0.1 grams of hydride silicone oil in a tinfoil surrounded conical flask. 20 mL carbon tetrachloride ($CCl_4$) is added into the flask to dissolve the silicone oil. and the flask is further sealed to avoid light exposure. Then, excess bromine acetic acid solution (with an availability ratio of about 10 mL) is added into the flask along with 10 mL of water. The flask is further sealed to avoid light exposure. After thirty minutes, the seal is opened and 25 ml 10% wt potassium iodide (KI) aqueous solution is added to the solution. The solution is then vibrated for 1 to 2 minutes. Then, a standard 0.1 mol/L sodium thiosulfate ($Na_2S_2O_3$) aqueous solution is added to titrate the sample solution with vibration. 1 mL of a 1 wt. % starch aqueous solution is added to the solution as an indicator. When the color of the solution (e.g., blue) changes, titration is stopped and the consumption of sodium thiosulfate is calculated. This process is then repeated for other samples. To prepare a control sample, the process is repeated with no silicone oil. The content of Si—H groups (mmol/g) is as following $$N2 = \frac{(Vd - Vc) * M2}{G2}$$

wherein: N2 is the mole ratio of Si—H groups (mmol/g); Vd is the volume (ml) of sodium thiosulfate solution titration for hydride silicone oil sample; Vc is the volume (ml) of sodium thiosulfate solution titration for blank sample; G2 is the weight (g) of hydride silicone oil; M2 is the mole concentration (mol/l) of the standard sodium thiosulfate solution.

The mole ratio of Si—H groups (mmol/g) in silicone oil may be in an amount as little as 0.0001, 0.001, 0.01, 0.1, as great as 1, 5, 10, 50 or within any range defined between any two of the foregoing values, such as 0.01 to 1, 0.1 to 5, or 0.0001 to 50. In one exemplary embodiment, the mole ratio of Si—H groups is in the amount of 0.2 to 2.

In one exemplary embodiment, the crosslinking silicone oil comprises a hydride functional silicone oil having an organo-silicone component and Si—H groups. Exemplary hydride functional silicone oils include hydride-terminated silicone oils and hydride-grafted silicone oils in which the Si—H group is grafted onto the polymer chain, and combinations thereof.

In one exemplary embodiment, the hydride-terminated silicone oil is a hydride terminated polydimethylsiloxane such as DMS-H05, DMS-H21, DMS-H25, DMS-H31, or DMS-H41, each available from Gelest, Inc. In one exemplary embodiment, the hydride-terminated silicone oil is a methylhydrosiloxane-dimethylsiloxane copolymer, such as a trimethylsiloxyl terminated or hydride terminated. Exemplary trimethylsiloxyl terminated copolymers include HMS-013, HMS-031, HMS-064, HMS-071, HMS-082, HMS-151, HMS-301, HMS-501; exemplary hydride terminated copolymers include HMS-H271; each of which is available from Gelest, Inc. In one exemplary embodiment, the hydride-grafted silicone oil is polymethylhydrosiloxane with trimethylsiloxyl terminated, such as HMS-991, HMS-992, HMS-993, each available from Gelest, Inc.

In one exemplary embodiment, the hydride-grafted silicone oil is polyethylhydrosiloxane with triethylsiloxyl terminated, such as HES-992, available from Gelest, Inc. In one exemplary embodiment, the hydride-grafted silicone oil is methylhydrosiloxane-octylmethylsiloxane copolymer, such as HAM-301 available from Gelest, Inc.

In one exemplary embodiment, the hydride functional oil is a Q resin or T resin, Exemplary T resins include SST-3MH1.1, exemplary Q resins include HQM-105 and HQM-107, each available from Gelest, Inc.

In one exemplary embodiment, the polysiloxane is a hydride functional oil, such as Andri® XL-10, Andri® XL-12 available from AB Specialty Silicones, such as RH-DH04, and RH-H503 available from RUNHE, such as KE-1012-B, KE-1031-B, KE-109E-B, KE-1051J-B, KE-1800T-B, KE1204B, KE1218B available from Shin-Etsu, such as SILBIONE® RT Gel 4725 SLD B available from Bluestar, such as SilGel® 612 B, ELASTOSIL® LR 3153B, ELASTOSIL® LR 3003B, ELASTOSIL® LR 3005B, SEMICOSIL® 961B, SEMICOSIL® 927B, SEMICOSIL® 205B, SEMICOSIL® 9212B, SILPURAN® 2440 available from Wacker, such as Siolpren® LSR 2010B available from Momentive, such as XIAMETER® RBL-9200 B, XIAMETER® RBL-2004 B, XIAMETER® RBL-9050 B, XIAMETER® RBL-1552 B, Silastic® FL 30-9201 B, Silastic® 9202 B, Silastic® 9204 B, Silastic® 9206 B, SYLGARD® 184B, Dow Corning® QP-1 B, Dow Corning® C6 B, Dow Corning® CV9204 B available from Dow Corning.

In one exemplary embodiment, the polysiloxane includes a silicone rubber such as the KE series products available from Shin-Etsu, such as SILBIONE® available from Bluestar, such as ELASTOSIL®, SilGel®, SILPURAN®, and SEMICOSIL® available from Wacker, such as Silopren® available from Momentive, such as Dow Corning®, Silastic®, XIAMETER®, Syl-Off® and SYLGARD® available from Dow Corning, such as Andril® available from AB specialty Silicones. Other polysiloxanes are available from Wacker, Shin-etsu, Dowcoring, Momentive, Bluestar, RUNHE, AB Specialty Silicones and Gelest.

Exemplary cross linking silicone oils may have a kinematic viscosity as little as 0.5 cSt, 5 cSt, 100 cSt, 200 cSt, as great as 1,000 cSt, 10,000 cSt, 100,000 cSt, or within any range defined between any two of the foregoing values as measured according to ASTM D445, such as between 0.5 cSt and 100,000 cSt, 5 cSt and 10,000 cSt, 100 cSt and 1,000 cSt, or 200 cSt and 1,000 cSt. In one exemplary embodiment, the cross linking silicone oil has a kinematic viscosity between 300 cSt and 700 cSt.

The cross linking silicone oil may be present in an amount as little as 0.1 wt. %, 0.2 wt. %, 0.4 wt. %, as great as 0.6 wt. %, 0.8 wt. %, 1.0 wt. %, or within any range defined between any two of the foregoing values, based on the total weight of the thermal gel, such as 0.1 wt. % to 1.0 wt. %, 0.1 wt. % to 0.5 wt. %, or 0.1 wt. % to 0.4 wt. %. In an exemplary embodiment, the cross-linking silicone oil is 0.45 wt. % based on the total weight of the thermal gel.

Exemplary silicone oils may have a weight ($M_w$) average molecular weight as little as 50 Daltons, 100 Daltons, 1000 Daltons, 10,000 Daltons, 50,000 Daltons, 70,000 Daltons, 100,000 Daltons, as great as 1,000,000 Daltons, 10,000,000 Daltons, 100,000,000 Daltons, or within any range defined between any two of the foregoing values, such as between 50 Daltons and 100,000,000 Daltons, 1000 Daltons to 10,000,000 Daltons, or 50,000 Daltons to 1,000,000 Daltons.

The total content of Si—H groups ($T_{Si-H}$, mmol) in total formulation is calculated by dividing the mole ratio of Si—H groups (mmol/g) of cross linking silicone oil in second component by the weight (g) of crosslinking silicone oil in second component.

The ratio of total content of Si—H groups ($T_{Si-H}$) to total content of vinyl groups ($T_{vinyl}$), calculated by $T_{Si-H}/T_{vinyl}$, may be in an amount as little as 0.0001, 0.001, 0.01, as great as 0.1, 1, 10, 100,1000 or within any range defined between any two of the foregoing values, such as between 0.001 to 0.1, 0.01 to 1, or 0.001 to 100. In an exemplary formulation, the ratio of total content of Si—H groups ($T_{Si-H}$) to total content of vinyl groups ($T_{vinyl}$) may be between 0.03 to 10.

5. Coupling Agent

The TIM may also include one or more coupling agents that function to interact with both the filler and the polymer matrix of the silicone oils to promote a strong bond at the interface of the two materials. This helps to separate filler particle aggregates disperse the filler particles into the polymer matrix, and create better adhesion of thermally conductive filler(s) to the polymer matrix. Exemplary coupling agents include silane coupling agents with general formula Y—(CH$_2$)$_n$—Si—X$_3$, wherein Y is organofunctional group, X is hydrolyzable group and n is 10-20. Organofunctional group Y includes alkyl, glycidoxy, acryloxyl, methylacryloxyl, amine. Hydrolyzable group X includes alkyloxy, acetoxy. In some exemplary embodiments, the silane coupling agent includes alkyltrialkoxysilanes. Exemplary alkytrialkoxy silane comprise decyltrimethoxysilane, undecyltrimethoxylsilane, hexadecyltrimethoxysilane, octadecyltrimethoxysilane. Other exemplary coupling agents include silane coupling agents and organometallic compounds, such as include titanate coupling agents and zirconate coupling agents.

Exemplary silane coupling agents include silane coupling agents with an aliphatic group. Exemplary coupling agents include titanium IV 2,2 (bis 2-propenolatomethyl)butanolato, tris(dioctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis(dioctyl)hydrogen phosphite; zirconium IV 2,2 (bis 2-propenolatomethyl)butanolato, tris (diisooctyl)pyrophosphato-O; zirconium IV 2,2-bis(2-propenolatomethyl) butanolato, cyclo di[2,2-(bis 2-propenolatomethyl) butanolato], pyrophosphato-O,O, and hexadecyltrimethoxysilane. In another exemplary embodiment, the coupling agent is KR-TTS available from Kenrich Chemical Company.

In one exemplary embodiment, the TIM includes hexadecyltrimethoxysilane as the coupling agent as shown in the formula below.

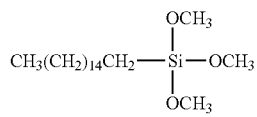

Exemplary coupling agents interact with exemplary fillers as shown in the example reaction below. Alumina is the representative filler used in the reaction below; however, other alternative fillers may be used. As shown, the coupling agent is added to water and undergoes hydrolysis to remove an ethoxide group. The products then undergo a modification reaction where water is removed and the coupling agent and alumina are bonded together.

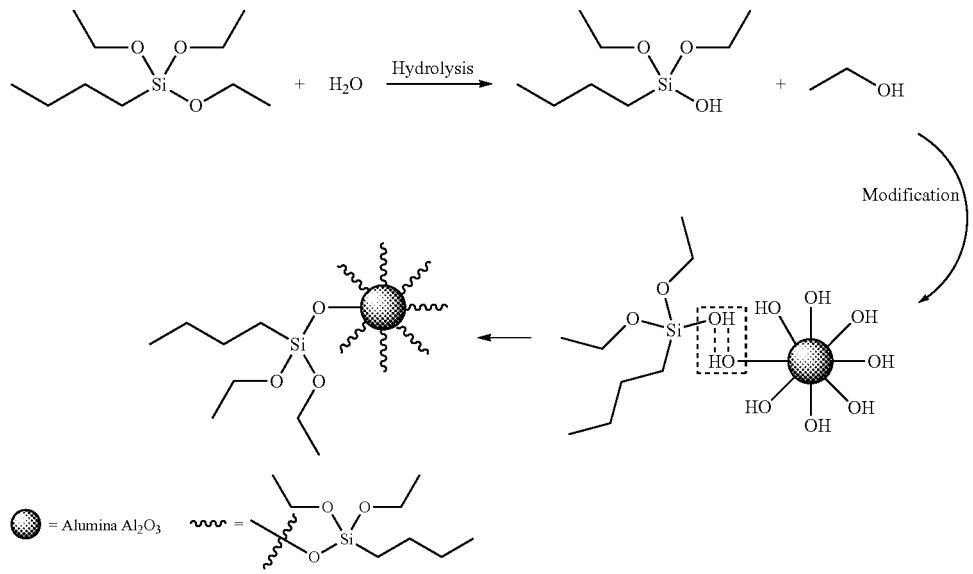

In some exemplary embodiments, the TIM may comprise the one or more coupling agents in an amount as little as 0.1 wt. %, 0.25 wt. %, 0.5 wt. %, 0.67 wt. %, 0.75 wt. %, as great as 1 wt. %, 1.5 wt. %, 2 wt. %, 5 wt. %, 10 wt. %, or within any range defined between any two of the foregoing values, based on the total weight of the TIM, such as 0.1 wt. % to 10 wt. %, 0.1 wt. % to 1 wt. %, or 0.25 wt. % to 0.67 wt. %. In one exemplary embodiment, the TIM includes a coupling agent in the amount of 0.6 wt. %.

The above components of the TIM (long chain, alkyl silicone oil; long chain, vinyl terminated alkyl silicone oil; long chain, single end, hydroxyl terminated silicone oil; crosslinker; catalyst; inhibitor; and coupling agent) form a polymer matrix that is combined with one or more thermally conductive fillers to form the TIM. The polymer matrix of the TIM may be in an amount as little as 3 wt. %, 4 wt. %, 5 wt. %, as great as 10 wt. %, 12.5 wt. %, 15 wt. %, or within any range defined between any two of the foregoing values, based on the total weight of the TIM, such as 3 wt. % to 15 wt. %, 4 wt. % to 12.5 wt. %, or 5 wt. % to 10 wt. %. In one exemplary embodiment, the TIM includes a polymer matrix in the amount of about 8.42 wt. %. In another exemplary embodiment, the TIM includes a polymer matrix in the amount of about 6.2 wt. %.

6. Thermally Conductive Filler

The TIM includes one or more thermally conductive fillers. Exemplary thermally conductive fillers include metals, alloys, nonmetals, metal oxides and ceramics, and combinations thereof. The metals include, but are not limited to, aluminum, copper, silver, zinc, nickel, tin, indium, and lead. The nonmetals include, but are not limited to, carbon, graphite, carbon nanotubes, carbon fibers, graphenes, boron nitride and silicon nitride. The metal oxide or ceramics include but not limited to alumina (aluminum oxide), aluminum nitride, boron nitride, zinc oxide, and tin oxide.

The TIM may comprise the one or more thermally conductive fillers in an amount as little as 10 wt. %, 20 wt. %, 25 wt. %, 50 wt. %, as great as 75 wt. %, 80 wt. %, 85 wt. %, 90 wt. %, 95 wt. %, 97 wt. %, or within any range defined between any two of the foregoing values, based on the total weight of the TIM, such as 10 wt. % to 95 wt. %, 50 wt. % to 95 wt. %, or 85 wt. % to 97 wt. %.

Exemplary thermally conductive fillers may have an average particle size of as little as 0.1 microns, 1 micron, 10 microns, as great as 50 microns, 75 microns, 100 microns or within any range defined between any two of the foregoing values.

In one exemplary embodiment, the TIM may include a first thermally conductive filler and a second thermally conductive filler, wherein the first thermally conductive filler and the second thermally conductive filler each have an average particle size greater than 1 micron.

In one exemplary embodiment, the TIM may include a first thermally conductive filler, a second thermally conductive filler, and a third thermally conductive filler, wherein the first thermally conductive filer has a particle size greater than 10 micron, the second thermally conductive filler has an average particle size as little as 1 micron, 2 microns, 4 microns, as great as 6 microns, 8 microns, 10 microns, or within any range defined therebetween, and the third thermally conductive filler has an average particle size less than 1 micron.

In one exemplary embodiment, the TIM includes a first thermally conductive filler in the amount of as little as 30 wt. %, 35 wt. %, 40 wt. %, as great as 45 wt. %, 50 wt. %, 60 wt % or within any range defined between any two of the foregoing values with respect to the total TIM composition. The first thermally conductive filler has an average particle size of as little as 30 microns. 35 microns, 40 microns, as great as 45 microns, 50 microns, 60 microns, or within any range defined between any two of the foregoing values. The exemplary TIM further includes a second thermally conductive filler in the amount of as little as 30 wt. %, 35 wt. %, 40 wt. %, as great as 45 wt. %, 50 wt. %, 60 wt. % or within any range defined between any two of the foregoing values with respect to the total TIM composition. The second thermally conductive filler has an average particle size of as little as 1 micron, 3, microns. 5 microns, as great as 10 microns, 15 microns, 20 microns, or within any range defined between any two of the foregoing values.

In one exemplary embodiment, the TIM includes a first thermally conductive filler in the amount of as little as 30 wt. %, 35 wt. %, 40 wt. %, as great as 45 wt. %, 50 wt. %, 60 wt % or within any range defined between any two of the foregoing values with respect to the total TIM composition. The first thermally conductive filler having an average particle size of as little as 30 microns. 35 microns, 40 microns, as great as 45 microns, 50 microns, 60 microns, or within any range defined between any two of the foregoing values. The exemplary TIM further includes a second thermally conductive filler in the amount of as little as 5 wt. %, 10 wt. %, 15 wt. %, as great as 25 wt. %, 30 wt. %, 40 wt % or within any range defined between any two of the foregoing values with respect to the total TIM composition. The second thermally conductive filler having an average particle size of as little as 1 micron, 3, microns. 5 microns, as great as 10 microns, 15 microns, 20 microns, or within any range defined between any two of the foregoing values. The exemplary TIM further includes a third thermally conductive filler in the amount of as little as 5 wt. %, 10 wt. %, 15 wt. %, as great as 25 wt. %, 30 wt. %, 40 wt % or within any range defined between any two of the foregoing values with respect to the total TIM composition. The third thermally conductive filler having an average particle size of as little as 0.1 microns, 0.3, microns. 0.5 microns, as great as 1 micron, 1.5 microns, 2 microns, or within any range defined between any two of the foregoing values.

Exemplary thermal conductive fillers include ceramic fillers or metal fillers of different sizes such as aluminum, alumina, and zinc oxide.

6. Exemplary Formulations of the Thermal Interface Material

In a first non-limiting illustrative embodiment, the TIM includes about 2 wt. % to about 10 wt. % at least one long chain silicone oil, about 0.1 wt. % to about 5 wt. % coupling agent, about 50 wt. % to about 95 wt. % thermally conductive filler, about 0.1 wt. % to about 5 wt. % addition inhibitor, about 0.1 wt. % to about 5 wt. % addition catalyst, and about 0.1 wt. % to 1.0 wt. % crosslinker.

In a second non-limiting illustrative embodiment, the TIM includes about 2 wt. % to about 10 wt. % of at least one long chain silicone oil, about 0.1 wt. % to about 5 wt. % of a coupling agent, about 25 wt. % to about 50 wt. % of a first thermally conductive filler, about 25 wt. % to about 50 wt. % of a second thermally conductive filler, about 0.1 wt. % to about 5 wt. % addition inhibitor, about 0.1 wt. % to about 5 wt. % addition catalyst, and about 0.1 wt. % to 1.0 wt. % crosslinker.

In a third non-limiting illustrative embodiment, the TIM includes about 2 wt. % to about 10 wt. % of at least one long chain silicone oil, about 0.1 wt. % to about 5 wt. % of a coupling agent, about 25 wt. % to about 50 wt. % of a first thermally conductive filler, about 5 wt. % to about 40 wt. % of a second thermally conductive filler, about 5 wt. % to about 40 wt. % of a third thermally conductive filler, about 0.1 wt. % to about 5 wt. % addition inhibitor, about 0.1 wt. % to about 5 wt. % addition catalyst, and about 0.1 wt. % to 1.0 wt. % crosslinker.

7. Exemplary Properties of the Thermal Interface Material

In some exemplary embodiments, a thermal interface material as described above has post cure elastic properties (e.g., recovery after compression), high thermal conductivity, viscosity, and hardness. Post cure recovery of the thermal interface material is tested by applying a compression force to the thermal interface material/gel to 50% strain/compression based on the original thickness of the thermal interface material/gel for 2 hours at room temperature. Then, the compression force is released, and the thermal interface material/gel is relaxed for 1 hour after which the thickness of the thermal interface material/gel is measured. The difference in thickness represents the recovery of the thermal interface material/gel.

In some exemplary embodiments, a thermal interface material as described above has excellent post cure elastic/recovery properties. The thermal interface material/gel has elastic/recovery properties that range from as little as 75% recovery, 80% recovery, 85% recovery, as great as 90% recovery, 95% recovery, 100% recovery, or within any range defined between any two of the foregoing values based on the thickness of the thermal interface material/gel prior to compression. In one exemplary embodiment, the thermal interface material/gel has a recovery of about 85%. In another exemplary embodiment, the thermal interface material/gel has a recovery of about 100%.

In some exemplary embodiments, a thermal interface material as described above has a thermal conductivity of as little as 1 W/m·K, 2 W/m·K, 3 W/m·K, as great as 4 W/mK, 7 W/m·K, 10 W/m·K, or within any range defined between any two of the foregoing values. An exemplary thermal conductivity test method standard is ASTM D5470. In one exemplary embodiment, a thermal interface material as described above has the thermal conductivity of about 3.5 W/m·K. In another exemplary embodiment, a thermal interface material as described above has the thermal conductivity of about 4.7 W/m·K.

In some exemplary embodiments, a thermal interface material as described above has a pre-cure viscosity of as little as 100 Pa·s, 150 Pa·s, 200 Pa·s, as great as 250 Pa·s, 275 Pa·s, 300 Pa·s, or within any range defined between any two of the foregoing values at 23° C. An exemplary viscosity test method standard is DIN 53018. In one particular embodiment, the viscosity is tested by a Haake viscometer. In one exemplary embodiment, the thermal interface material has a viscosity of about 120 Pa·s. In another exemplary embodiment, the thermal interface material has a viscosity of about 275 Pa·s.

In some exemplary embodiments, a thermal interface material as described above has a post cure hardness value of as little as 25 Shore OO, 30 Shore OO, 35 Shore OO, as great as 40 Shore OO, 45 Shore OO, 50 Shore OO, or within any range defined between any two of the foregoing values, such as between 25 Shore OO and 50 Shore OO, between 25 Shore OO and 45 Shore OO, or between 25 Shore OO and 40 Shore OO, for example, as determined by a Shore OO type durometer and ASTM D2240. In one exemplary embodiment, the thermal interface material has a hardness of 25 Shore OO. In another exemplary embodiment, the thermal interface material has a hardness of 40 Shore OO.

B. Methods of Forming a Thermal Interface Material

Referring now to FIG. 1, an exemplary method 100 of making a thermal interface material is shown. As shown, long chain alkyl silicone oil; long chain, vinyl silicone oil; long chain, single-end hydroxyl terminated silicone oil; coupling agent; catalyst; and inhibitor are weighed and added to a mixer as indicated at block 102. The mixture is then mixed for 15 minutes at room temperature as also indicated at block 102. Then, at block 104, a crosslinker is added to the mixer and the mixture is mixed for 10 minutes. After which, at block 106, the thermally conductive filler of the largest size is added to the mixer and mixed with the mixture for 10 minutes. Then, the thermally conductive filler of the next largest size (e.g., medium sized) is added to the mixer and the subsequent mixture is mixed for an additional 10 minutes as indicated at block 108. Then, as shown in block 110, the thermally conductive filler of the smallest size is added to the mixer and the mixture is mixed for an additional 30 minutes. Vacuum is then applied to the mixer and mixture while mixing is continued for 30 additional minutes as shown in block 112. After which, at block 114, the vacuum is stopped, and the resulting mixture/formulation is packaged and/or subsequently cured at block 116.

C. Applications Utilizing the Thermal Interface Material

Referring again to FIG. 1, in some exemplary embodiments, the thermal interface material is positioned as a TIM 1 between an electronic component 12 and a heat spreader 14, as indicated by TIM 18. In some exemplary embodiments, the thermal interface material is positioned as a TIM 2 between a heat spreader 14 and a heat sink 16, as indicated by TIM 20. In some exemplary embodiments, the thermal interface material is positioned as a TIM 1.5 (not shown) between an electronic component 12 and a heat sink 16.

EXAMPLES

Example 1

A thermal interface material for Example 1, Example 2, Example 3, Example 4, Comparative Example 1 (Comp. Ex. 1), Comparative Example 2 (Comp. Ex. 2), Comparative Example 3 (Comp. Ex. 3), and Comparative Example 4 (Comp. Ex. 4) was prepared according to the formulations provided in Table 1 below. The formulations respective properties are also shown in Table 1 and discussed further below.

TABLE 1

Formulations (wt. %) for Example 1, Example 2, Example 3, Example 4, Comparative Example 1, Comparative Example 2, Comparative Example 3, and Comparative Example 4

| Raw materials | Ex 1 | Comp. Ex 1 | Ex 2 | Comp. Ex 2 | Ex 3 | Comp. Ex 3 | Ex 4 | Comp. Ex 4 |
|---|---|---|---|---|---|---|---|---|
| Long chain, alkyl silicone oil ($150 < n + m < 600$, $X = 12$) | 3 | | 2 | | 1.4 | | 1.4 | |
| Long chain, vinyl terminated alkyl silicone oil ($600 < n + m < 3000$, $X = 12$) | 3 | | 2 | | 0.8 | | 0.8 | |
| Long chain, single end hydroxyl terminated silicone oil ($60 < n + m < 180$, $X = 12$, $y = 2$, hydroxy value 9 mg KOH/g) | 1.2 | | 1 | | 1 | | 1 | |
| Vinyl terminated silicone oil (500 mPa · s) | | 7.2 | | 5 | | 3.2 | | 3.2 |
| Cross linker (Si—H) | 0.45 | 0.45 | 0.45 | 0.45 | 0.15 | 0.15 | 0.15 | 0.15 |
| Catalyst | 0.01 | 0.01 | 0.01 | 0.01 | 0.03 | 0.03 | 0.03 | 0.03 |
| Inhibitor | 0.02 | 0.02 | 0.02 | 0.02 | 0.02 | 0.02 | 0.02 | 0.02 |
| Coupling agent | 0.6 | 0.6 | 0.6 | 0.6 | 0.6 | 0.6 | 0.6 | 0.6 |
| Thermally Conductive Filler ($Al_2O_3$ 120 μm) | | | | | 40 | 40 | | |
| Thermally Conductive Filler ($Al_2O_3$ 40 μm) | 47 | 47 | 45 | 45 | 21 | 21 | 10 | 10 |
| Thermally Conductive Filler ($Al_2O_3$ 38 μm) | | | | | | | 38 | 38 |

TABLE 1-continued

Formulations (wt. %) for Example 1, Example 2, Example 3, Example 4, Comparative Example 1, Comparative Example 2, Comparative Example 3, and Comparative Example 4

| Raw materials | Ex 1 | Comp. Ex 1 | Ex 2 | Comp. Ex 2 | Ex 3 | Comp. Ex 3 | Ex 4 | Comp. Ex 4 |
|---|---|---|---|---|---|---|---|---|
| Thermally Conductive Filler (Al$_2$O$_3$ 5 µm) | 43 | 43 | 25 | 25 | 15 | 15 | 15 | 15 |
| Thermally Conductive Filler (Al$_2$O$_3$ 0.5 µm) | | | 22 | 22 | 20 | 20 | 20 | 20 |
| Viscosity (Pa · s) Before Curing | 120 | 260 | 275 | 980 | 1800 | >200000 | 1900 | >200000 |
| Hardness After Curing (Shore OO) | 25 | 50 | 40 | >80 | >70 | Out of test range | >70 | Out of test range |
| Thermal Conductivity (W/mK) | 3.52 | 3.48 | 4.7 | 4.8 | 8.6 | 7.6 | 11.8 | 10.6 |
| Recovery (%) after 2 hour 50% compression | 100% | 50% | 85% | 20% | 3% | 0% | 5% | 0% |

To prepare the formulation of Example 1, the silicone oil, coupling agent, catalyst, and inhibitor were combined and mixed in a mixer for 15 minutes. The crosslinker was then added and the subsequent mixture was mixed for 10 minutes. The thermally conductive fillers with an average diameter of 40 µm were then added, and the mixture was mixed for 10 minutes. Then, the thermally conductive fillers with an average diameter of 5 µm were added, and the resulting mixture was mixed for 30 minutes. After which, vacuum mixing was applied to the mixture for 30 minutes to remove air bubbles and obtain the sample of Example 1.

To prepare the formulation of Example 2, the preparation steps of Example 1 as discussed above were performed, and the thermally conductive fillers with an average diameter of 0.5 µm were added to the mixture and the resulting mixture was mixed prior to the application of vacuum mixing.

Comparative Examples 1 and 2 were prepared similarly to Examples 1 and 2; however, a vinyl terminated silicone oil having a viscosity of 500 mPa·s was used instead of the long chain silicone oils of Examples 1 and 2.

As mentioned previously, the viscosity of the samples were tested by Haake viscometer. The hardness was tested by a shore OO type durometer. The thermal conductivity was tested by a TIM tester based on the standard of ASTMD5470.

The recovery test was performed by the following method. The thermal gel sample was compressed to a thickness of 2 millimeters (mm) and cured completely in a 150° C. oven. The sample was then die cut into a round pad having a 1 inch diameter. Then, the round pad was compressed to a 50% strain or 50% of the original thickness of the round pad (i.e., 1 mm) and was held in the compressed state for 2 hours at room temperature. The compression force was then released and the round pad was relaxed for 1 hour after which its thickness was measured and recovery was determined—if the measured thickness was 2 mm, recovery was 100%; if the thickness was 1 mm, recovery was 0%.

As shown in Table 1 above, Examples 1 and 2 showed reduced viscosity before curing, a lower hardness value, and comparable thermal conductivity values as compared to Comparative Example 1 and Comparative Example 2.

In addition, Examples 1 and 2 exhibited greater recovery properties than Comparative Examples 1 and 2. In particular, Examples 1 and 2 exhibited recoveries of 100% and 85%, respectively. By comparison, Comparative Examples 1 and 2 exhibited lower recoveries of 50% and 20% respectively.

Example 3 showed that the thermal interface material with high thermal conductive filler loading (thermal conductivity greater than 7.5 W/m K) also exhibited better elastic properties than Comparative Example 3. However, the elastic performance is less than that of Example 1 and Example 2.

Example 4 showed that the thermal interface material with AlN filler (thermal conductivity greater than 11 W/m K also exhibited better elastic properties and lower viscosity before curing than Comparative Example 4. However, the elastic performance is less than that of Example 1 and Example 2.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

ASPECTS

Aspect 1 is a thermal interface material comprising a polymer matrix including: at least one long chain alkyl silicone oil; at least one long chain, vinyl terminated alkyl silicone oil; and at least one single end hydroxyl terminated silicone oil; wherein at least one of the long chain alkyl silicone oil; the long chain, vinyl terminated alkyl silicone oil; and the long chain, single end hydroxyl terminated silicone oil having at least one branch chain of between 2 and 32 alkyl carbons; and at least one thermally conductive filler.

Aspect 2 is the thermal interface material of Aspect 1, wherein the long chain alkyl silicone oil has a general formula of:

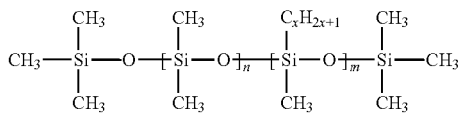

where n ranges from 0 to 5000, x ranges from 2 to 32, and m ranges from 5 to 2000, and n+m ranges from 50 to 5000.

Aspect 3 is the thermal interface material of either Aspect 1 or Aspect 2, wherein the long chain, vinyl terminated alkyl silicone oil has a general formula of:

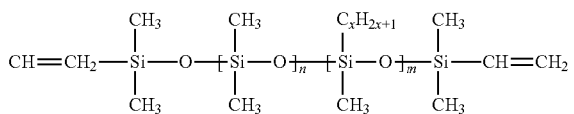

where n ranges from 0 to 5000, x ranges from 2 to 32, and m ranges from 5 to 5000, and n+m ranges from 50 to 10000.

Aspect 4 is the thermal interface material of any of Aspects 1-3, wherein the long chain, single end hydroxyl terminated silicone oil has a general formula of:

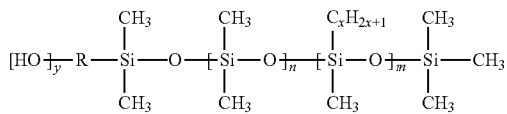

where R is an alkyl group, n ranges from 5 to 1000, x ranges from 2 to 32, y ranges from 1 to 3, m ranges from 0 to 500, and n+m ranges from 5 to 1000.

Aspect 5 is the thermal interface material of any of Aspects 1-4, wherein the long chain, single end hydroxyl terminated silicone oil has a hydroxyl value in the range of 1 mgKOH/g to 200 mgKOH/g.

Aspect 6 is the thermal interface material of any of Aspects 1-5, wherein the thermally conductive filler includes at least a first thermally conductive filler and a second thermally conductive filler between 85 wt. % to 97 wt. %.

Aspect 7 is the thermal interface material of any of Aspect 1-6, wherein the thermal interface material has a post cure recovery between 75% and 100% after 50% strain is applied for 2 hours at room temperature.

Aspect 8 is the thermal interface material of any of Aspects 1-7, wherein the thermal interface material comprises from 0.5 wt. % to 5 wt. % of the long chain alkyl silicone oil; from 0.5 wt. % to 5 wt. % of the long chain, vinyl terminated alkyl silicone oil;
from 0.5 wt. % to 2 wt. % of the long chain, single end hydroxyl terminated silicone oil; and from 50 wt. % to 95 wt. % of the thermally conductive filler.

Aspect 9 is the thermal interface material of any of Aspects 1-8, wherein the thermal interface material has a hardness between 25 Shore OO and 50 Shore OO.

Aspect 10 is a thermal interface material comprising a polymer matrix including: at least one long chain silicone oil having between 4 and 16 alkyl carbons; wherein the at least one long chain silicone oil includes: a long chain alkyl silicone oil; a long chain, vinyl terminated alkyl silicone oil; and a single end hydroxyl terminated silicone oil; an addition inhibitor; a crosslinker; a catalyst; a coupling agent; and at least one thermally conductive filler; wherein the thermal interface material comprises: from 3 wt. % to 15 wt. % of the polymer matrix; and from 50 wt. % to 95 wt. % of the thermally conductive filler.

Aspect 11 is the thermal interface material of Aspect 10, wherein the thermal interface material comprises from 0.5 wt. % to 5 wt. % of the long chain alkyl silicone oil; from 0.5 wt. % to 5 wt. % of the long chain, vinyl terminated alkyl silicone oil;
from 0.5 wt. % to 2 wt. % of the long chain, single end hydroxyl terminated silicone oil; from 0.01 wt. % to 0.5 wt. % of the catalyst; from 0.01 wt. % to 1 wt. % of the addition inhibitor; from 0.1 wt. % to 1 wt. % of the crosslinker; from 0.1 wt. % to 10 wt. % of the coupling agent; and from 50 wt. % to 95 wt. % of the thermally conductive filler.

Aspect 12 is the thermal interface material of either Aspect 10 or Aspect 11, wherein the thermally conductive filler includes a first thermally conductive filler and a second thermally conductive filler, wherein the first thermally conductive filer is a metal oxide, a ceramic, or a combination thereof, having a particle size greater than 10 microns and the second thermally conductive filler is a metal oxide having a particle size between 1 micron and 10 microns.

Aspect 13 is the thermal interface material of any of Aspects 10-12, wherein the long chain alkyl silicone oil has a general formula of:

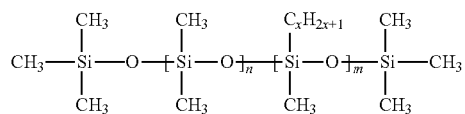

where n ranges from 0 to 5000, x ranges from 2 to 32, and m ranges from 5 to 2000, and n+m ranges from 50 to 5000.

Aspect 14 is the thermal interface material of Aspects 10-13, wherein the long chain, vinyl terminated alkyl silicone oil has a general formula of:

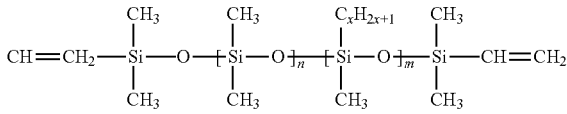

where n ranges from 0 to 5000, x ranges from 2 to 32, and m ranges from 5 to 5000, and n+m ranges from 50 to 10000.

Aspect 15 is the thermal interface material of any of Aspects 10-14, wherein the long chain, single end hydroxyl terminated silicone oil has a general formula of:

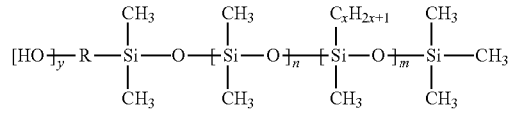

where R is an alkyl group, n ranges from 5 to 1000, x ranges from 2 to 32, y ranges from 1 to 3, m ranges from 0 to 500, and n+m ranges from 5 to 1000.

Aspect 16 is an electronic component comprising a heat sink; an electronic chip; a thermal interface material having a first surface layer and a second surface layer, the thermal interface material positioned between the heat sink and electronic chip, the thermal interface material including: a polymer matrix including:
at least one long chain silicone oil having between 4 and 16 alkyl carbons; wherein the at least one long chain silicone oil includes: a long chain alkyl silicone oil; a long chain; a vinyl terminated alkyl silicone oil; and a single end hydroxyl terminated silicone oil; an addition inhibitor; a crosslinker; a catalyst; a coupling agent; and at least one thermally conductive filler; wherein the thermal interface material comprises: from 3 wt. % to 15 wt. % of the polymer matrix; and from 50 wt. % to 95 wt. % of the thermally conductive filler.

Aspect 17 is the electronic component of Aspect 16, wherein the long chain alkyl silicone oil has a general formula of:

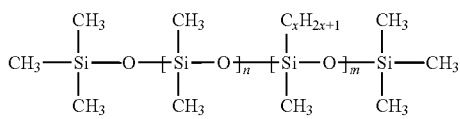

where n ranges from 0 to 5000, x ranges from 2 to 32, m ranges from 5 to 2000, and n+m ranges from 50 to 5000.

Aspect 18 is the electronic component of either Aspect 16 or Aspect 17, wherein the long chain, vinyl terminated alkyl silicone oil has a general formula of:

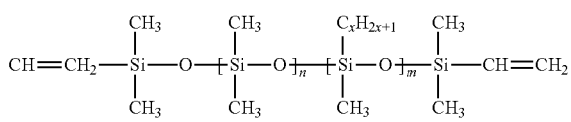

where n ranges from 0 to 5000, x ranges from 2 to 32, and m ranges from 5 to 5000, and n+m ranges from 50 to 10000.

Aspect 19 is the electronic component of any of Aspects 16-18, wherein the long chain, single end hydroxyl terminated silicone oil has a general formula of:

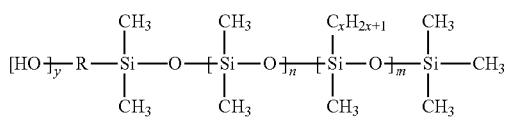

where R is an alkyl group, n ranges from 5 to 1000, x ranges from 2 to 32, y ranges from 1 to 3, m ranges from 0 to 500, and n+m ranges from 5 to 1000.

Aspect 20 is the electronic component of any of Aspects 16-19, wherein the first surface layer is in contact with a surface of the electronic chip and the second surface layer is in contact with the heat sink.

Aspect 21 is the electronic component of any of Aspects 16-20, wherein the electronic component further comprises a heat spreader positioned between the heat sink and the electronic chip, wherein the first surface layer is in contact with a surface of the electronic chip and the second surface layer is in contact with the heat spreader.

Aspect 22 is the electronic component of any of Aspects 16-21, the electronic component further comprises a heat spreader positioned between the heat sink and the electronic chip, wherein the first surface layer is in contact with a surface of the heat spreader and the second surface layer is in contact with the heat sink.

The invention claimed is:

1. A thermal interface material comprising:
a polymer matrix including:
at least one long chain alkyl silicone oil;
at least one long chain alkyl, vinyl terminated alkyl silicone oil; and
at least one long chain alkyl, single end hydroxyl terminated silicone oil;
wherein at least one of the long chain alkyl silicone oil; the long chain alkyl, vinyl terminated alkyl silicone oil; and the long chain alkyl, single end hydroxyl terminated silicone oil having at least one branch chain of between 2 and 32 alkyl carbons; and
at least one thermally conductive filler.

2. The thermal interface material of claim 1, wherein the long chain alkyl silicone oil has a general formula of:

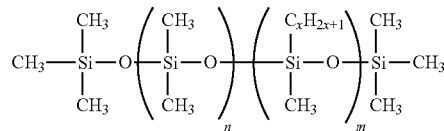

where n ranges from 0 to 5000, x ranges from 2 to 32, and m ranges from 5 to 2000, and n+m ranges from 50 to 5000.

3. The thermal interface material of claim 2, wherein the long chain alkyl, vinyl terminated alkyl silicone oil has a general formula of:

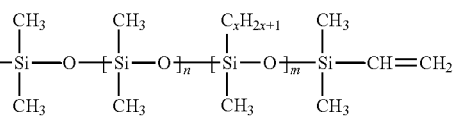

where n ranges from 0 to 5000, x ranges from 2 to 32, and m ranges from 5 to 5000, and n+m ranges from 50 to 10000.

4. The thermal interface material of claim 3, wherein the long chain alkyl, single end hydroxyl terminated silicone oil has a general formula of:

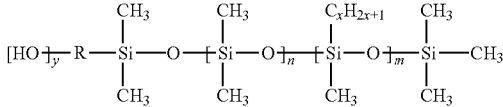

where R is an alkylene group, n ranges from 5 to 1000, x ranges from 2 to 32, y ranges from 1 to 3, m ranges from 0 to 500, and n+m ranges from 5 to 1000.

5. The thermal interface material of claim 4, wherein the long chain, single end hydroxyl terminated silicone oil has a hydroxyl value in the range of 1 mgKOH/g to 200 mgKOH/g.

6. The thermal interface material of claim 4, wherein the thermally conductive filler includes at least a first thermally conductive filler and a second thermally conductive filler between 85 wt. % to 97 wt. %, based on the total weight of the thermal interface material.

7. The thermal interface material of claim 1, wherein the thermal interface material has a post cure recovery between 75% and 100% after 50% strain is applied for 2 hours at room temperature.

8. The thermal interface material of claim 1, wherein the thermal interface material comprises:
   from 0.5 wt. % to 5 wt. % of the long chain alkyl silicone oil;
   from 0.5 wt. % to 5 wt. % of the long chain alkyl, vinyl terminated alkyl silicone oil;
   from 0.5 wt. % to 2 wt. % of the long chain alkyl, single end hydroxyl terminated silicone oil; and
   from 50 wt. % to 95 wt. % of the thermally conductive filler.

9. The thermal interface material of claim 1, wherein the thermal interface material has a hardness between 25 Shore OO and 50 Shore OO.

10. A thermal interface material comprising:
   a polymer matrix including:
      at least one long chain silicone oil having at least one branch chain of 4 and 16 alkyl carbons;
         wherein the at least one long chain silicone oil includes:
            a long chain alkyl silicone oil;
            a long chain alkyl, vinyl terminated alkyl silicone oil; and
            a long chain alkyl, single end hydroxyl terminated silicone oil;
      an addition inhibitor;
      a crosslinker;
      a catalyst;
      a coupling agent; and
      at least one thermally conductive filler;
   wherein the thermal interface material comprises:
      from 3 wt. % to 15 wt. % of the polymer matrix; and
      from 50 wt. % to 95 wt. % of the thermally conductive filler.

11. The thermal interface material of claim 10, wherein the thermal interface material comprises:
   from 0.5 wt. % to 5 wt. % of the long chain alkyl silicone oil;
   from 0.5 wt. % to 5 wt. % of the long chain alkyl, vinyl terminated alkyl silicone oil;
   from 0.5 wt. % to 2 wt. % of the long chain alkyl, single end hydroxyl terminated silicone oil;
   from 0.01 wt. % to 0.5 wt. % of the catalyst;
   from 0.01 wt. % to 1 wt. % of the addition inhibitor;
   from 0.1 wt. % to 1 wt. % of the crosslinker;
   from 0.1 wt. % to 10 wt. % of the coupling agent; and
   from 50 wt. % to 95 wt. % of the thermally conductive filler.

12. The thermal interface material of claim 10, wherein the thermally conductive filler includes a first thermally conductive filler and a second thermally conductive filler, wherein the first thermally conductive filer is a metal oxide, a ceramic, or a combination thereof, having a particle size greater than 10 microns and the second thermally conductive filler is a metal oxide having a particle size between 1 micron and 10 microns.

13. The thermal interface material of claim 10, wherein the long chain alkyl silicone oil has a general formula of:

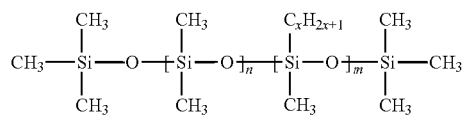

where n ranges from 0 to 5000, x ranges from 2 to 32, and m ranges from 5 to 2000, and n+m ranges from 50 to 5000.

14. The thermal interface material of claim 13, wherein the long chain alkyl, vinyl terminated alkyl silicone oil has a general formula of:

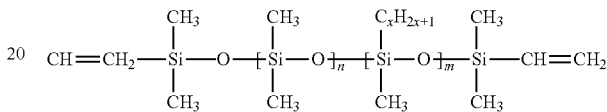

where n ranges from 0 to 5000, x ranges from 2 to 32, and m ranges from 5 to 5000, and n+m ranges from 50 to 10000.

15. The thermal interface material of claim 14, wherein the long chain alkyl, single end hydroxyl terminated silicone oil has a general formula of:

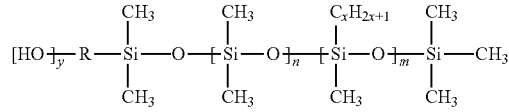

where R is an alkyl group, n ranges from 5 to 1000, x ranges from 2 to 32, y ranges from 1 to 3, m ranges from 0 to 500, and n+m ranges from 5 to 1000.

16. An electronic component comprising:
   a heat sink;
   an electronic chip;
   a thermal interface material having a first surface layer and a second surface layer, the thermal interface material positioned between the heat sink and electronic chip, the thermal interface material including:
   a polymer matrix including:
      at least one long chain silicone oil having at least one branch chain of 4 and 16 alkyl carbons;
         wherein the at least one long chain silicone oil includes:
            a long chain alkyl silicone oil; a long chain;
            a long chain alkyl, vinyl terminated alkyl silicone oil; and
            a long chain alkyl, single end hydroxyl terminated silicone oil;
      an addition inhibitor;
      a crosslinker;
      a catalyst;
      a coupling agent; and
      at least one thermally conductive filler;
   wherein the thermal interface material comprises:
      from 3 wt. % to 15 wt. % of the polymer matrix; and
      from 50 wt. % to 95 wt. % of the thermally conductive filler.

17. The electronic component of claim 16, wherein the long chain alkyl silicone oil has a general formula of:

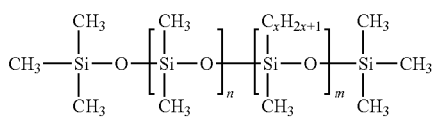

where n ranges from 0 to 5000, x ranges from 2 to 32, m ranges from 5 to 2000, and n+m ranges from 50 to 5000.

18. The electronic component of claim 17, wherein the long chain alkyl, vinyl terminated alkyl silicone oil has a general formula of:

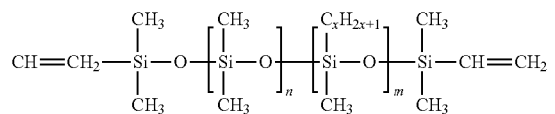

where n ranges from 0 to 5000, x ranges from 2 to 32, and m ranges from 5 to 5000, and n+m ranges from 50 to 10000.

19. The electronic component of claim 18, wherein the long chain alkyl, single end hydroxyl terminated silicone oil has a general formula of:

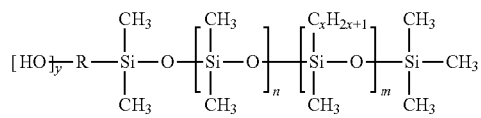

where R is an alkylene group, n ranges from 5 to 1000, x ranges from 2 to 32, y ranges from 1 to 3, m ranges from 0 to 500, and n+m ranges from 5 to 1000.

20. The electronic component of claim 16, wherein the first surface layer is in contact with a surface of the electronic chip and the second surface layer is in contact with the heat sink.

* * * * *